(12) United States Patent
Nelson

(10) Patent No.: US 7,451,063 B2
(45) Date of Patent: Nov. 11, 2008

(54) METHOD FOR DESIGNING PRODUCTS AND PROCESSES

(75) Inventor: Michael Timothy Nelson, Greenville, SC (US)

(73) Assignee: Red X Holdings LLC, Anacortes, WA (US)

( * ) Notice: Subject to any disclaimer, the term of this patent is extended or adjusted under 35 U.S.C. 154(b) by 534 days.

(21) Appl. No.: 10/198,915

(22) Filed: Jul. 19, 2002

(65) Prior Publication Data
US 2003/0033093 A1 Feb. 13, 2003

Related U.S. Application Data

(60) Provisional application No. 60/306,989, filed on Jul. 20, 2001.

(51) Int. Cl.
*G06F 11/30* (2006.01)
(52) U.S. Cl. .................................................... 702/183
(58) Field of Classification Search ................ 702/81, 702/82, 90, 179, 181–185, 193; 705/10, 705/400; 716/4, 5
See application file for complete search history.

(56) References Cited

U.S. PATENT DOCUMENTS

| 5,798,950 | A * | 8/1998 | Fitzgerald .................... 703/17 |
| 2002/0023251 | A1 * | 2/2002 | Nasr et al. ..................... 716/4 |
| 2002/0138336 | A1 * | 9/2002 | Bakes et al. .................. 705/10 |
| 2002/0138406 | A1 * | 9/2002 | Elgabry ....................... 705/38 |

OTHER PUBLICATIONS

"Potential Failure Mode and Effects Analysis (FMEA), Reference Manual" 3rd edition, SAE J-1739, pp. 1-78.

* cited by examiner

*Primary Examiner*—Edward Raymond
*Assistant Examiner*—Mohamed Charioui
(74) *Attorney, Agent, or Firm*—DWC Law Firm, P.S.

(57) ABSTRACT

A method for use in a system for prioritizing risks associated with the design and manufacture of products involves performing a failure mode detection analysis. Functions of the product and/or of the process and the effects of undesirable events related to malfunctions are characterized, and potential failure modes and causes for the effects are identified. The features of the product/process that are responsible for the undesirable effects are determined. Severity, occurrence and detectability of the undesirable events are evaluated using specific measures designed to encourage score keeping, and risk factor numbers are computed. The resultant numbers are ranked and prioritized for a set of selected functions. Risk reduction may then be performed through engineering activities directed to remedy causes associated with the malfunctioning features. Failure mode detection analysis may be updated to continue incremental and focused improvements to the product and/or process. The method permits the capture of potential failures before they reach the field and the customer.

28 Claims, 29 Drawing Sheets

| P/P * Function(s) | P/P Aspect(s) | Potential Effects of Failure | Potential Failure Mode(s) | Potential Causes of Failure | Severity | Occurrence | Detection | RFN | Focused Activities | Corrective Actions |
|---|---|---|---|---|---|---|---|---|---|---|
| 300 | 305 | 310 | 315 | 320 | 325 | 330 | 335 | 340 | 345 | 350 |
| | | | | | | | | | | |
| | | | | | | | | | | |
| | | | | | | | | | | |

* P/P : Product/Process

FIG. 3

| Function 300 | Part/Feature Name 305 | Potential Effects of Failure 310 | Potential Failure Mode 315 | Potential Causes of Failure 320 | Security 325 | Occurrence 330 | Detection 335 | RPN 340 |
|---|---|---|---|---|---|---|---|---|
| • Seal Pressure | • Packing Cup | • Potential Brake Force | • Air Leak between cyclinder and packing cup | • Excess clearance | | | | |
| | | • Ruptered Boot | | • Packing cup O.D. shrinkling over time | | | | |
| | | | | | | | | |
| | | | | | | | | |

FIG. 5

Product Severity Scale

| | Severity | | AIAG |
|---|---|---|---|
| 5.5 | Pintle Head falls off – Engine Failure Walk Home | 10 | Hazardous w/o warning. Safety/Non-compliance |
| | | 9 | Hazardous w/ warning. Safety/Non-compliance |
| 4.5 | Valve stuck open, Fail Emissions, loss of power | 8 | Very high, Vehicle inoperable, loss function |
| | | 7 | High Operable but reduced level of performance, Customer dissatisfied |
| 3.5 | No EGR, Open Circuit, or Stuck Closed, Fail Emissions, No Loss of Power | 6 | Moderate – Vehicle Operable but comfort/convenience item inoperable, Customer discomfort |
| | | 5 | Low – Operable, comfort/convenience items reduced performance, Some dissatisfaction |
| 2.5 | Mis-meter EGR, Loss of valve control, Emission Failure | 4 | Very Low – Fit, finish, squeak, rattle noticed by most |
| | | 3 | Minor – Fit, finish, squeak, rattle noticed by average |
| 1.5 | Exhaust Gas Leak, Minor Emissions Impact | 2 | Very Minor – Fit, finish, squeak, rattle, defect noticed by discriminating customer |

FIG. 6

Product Occurrence Scale

| | Product Occurrence | | AIAG – Probability of Failure | |
|---|---|---|---|---|
| 5.5 | Engineering Judgement | 10 | Very High – Almost inevitable | ≥ 1 in 2 |
| | | 9 | | 1 in 3 |
| 4.5 | Analysis to define potential product features | 8 | High – Repeated Failures | 1 in 8 |
| | | 7 | | 1 in 20 |
| 3.5 | Verification | 6 | Moderate – Occasional Failures | 1 in 80 |
| | | 5 | | 1 in 400 |
| 2.5 | Validation of specific failure mode | 4 | | 1 in 2000 |
| | | 3 | Low – Relatively Few Failures | 1 in 15000 |
| 1.5 | System Level Validation, Multiple Environments to Probe for unknown failure modes | 2 | | 1 in 150000 |
| | | 1 | Remote – Failure is unlikely | ≤1 into 1,500,000 |

FIG. 7

Product Detection Scale

| | Product Detection | | AIAG |
|---|---|---|---|
| 5.5 | Event Detected in Customer's hands | 10 | Absolute Uncertainty—Cannot Detect or No Design Control |
| | | 9 | Very Remote — chance design control will detect failure mode |
| 4.5 | Detected during Complete Assembly Testing, in-house validation | 8 | Remote — chance design control will Detect failure mode |
| | | 7 | Very Low — chance design control will detect failure mode |
| 3.5 | Detected during sub-assembly testing | 6 | Low — chance design control will detect failure mode |
| | | 5 | Moderate — chance design control will detect failure mode |
| 2.5 | Detection during Component Testing | 4 | Moderately high — chance design control will detect failure mode |
| | | 3 | High — chance design control will detect failure mode |
| 1.5 | Detecting during analysis | 2 | Very High — chance design control will detect failure mode |
| | | 1 | Almost Certain — chance design control will detect failure mode |

FIG. 8

FMDA : Scales                                    EGR Project

| | Severity | Product Occurrence | Product Detection | Process Occurrence | Process Detection |
|---|---|---|---|---|---|
| 5.5 | Pintle Head falls off – Engine Failure – Walk Home | Product Engineering Judgement | Event Detected in customer's hands during Service Monitoring | Process Engineering Judgement or uncontrollable process | Event Detected in Customer's hands |
| 4.5 | Valve stuck open, Fail Emissions, loss of power | Analysis to define potential product features | Detected during final validation at customer | Analysis to define potential process parameters | Event monitored in-house, using destructive test |
| 3.5 | No EGR, Open Circuit, or Stuck Closed, Fail Emissions, no loss of power | Verification for Product Features & tolerances, Linkage Drawings | Detected during Probe Test of component or Detected when building Product to feature tolerance extremes | Verification of Process parameters & specifications. Link to Control Plan. Drifting but controllable process. | Feature is monitored in-house using destructive test |
| 2.5 | Mis – meter EGR, Loss of valve control, Emission Failure | Validation of conceptual failure modes from FMDA | Detected during specific failure mode testing of component | Characterized operation, Validation of specific failure mode. | Feature is monitored 100% in-house using non-destructive test |
| 1.5 | Exhaust Gas Leak, Minor Emissions Impact | System Level Validation, Multiple Environments to probe for unknown failure modes | Detected before prototype build (e.g. previous generation parts, or analysis) | Process has been stressed. Run at rate. Stable and capable process. | Process parameter is controlled. Fail safe in place to shut down operation |
| | Assume everything above happens | Assume everything above happens | Assume everything above happens | Assume everything above happens | Assume everything above happens |

FIG. 9

DFMDA : Valve Example

| Part/Feature name | Function | Potential Failure Effect | Potential Failure Mode | Potential Causes of Failure | Severity | Occurrence | Detection | RFN 460 | |
|---|---|---|---|---|---|---|---|---|---|
| Valve Group | Prevent Leak | Power Loss & Emissions Failure | Pintle Head Not secured to Pintle Shaft | Pintle Shaft Groove Depth, Height & Position are incorrectly dimensioned &/or Tolerance | 4 | 5 | 3 | 60 | 465 |
| | | | | Pintle Head Specified material is too stiff | 5 | 5 | 5 | 125 | 470 |
| | | | | Pintle Head Hub Wall Thickness is too thick | 5 | 5 | 4 | 100 | 475 |
| | | | Cracked Pintle Head Hub | Pintle Head Specified material is too stiff | 5 | 5 | 5 | 125 | 480 |
| | | | | Pintle Head Hub Wall Thickness is too Thin | 5 | 1 | 5 | 25 | 485 |

| Function | Component/ Assembly Aspects | Effect | Failure Mode | Cause | Severity | Occurrence | Detection | RFN | RFN = Σ F.M. | RFN = Σ Causes | Engineering Activity |
|---|---|---|---|---|---|---|---|---|---|---|---|
| FUNCTION : DISENGAGE TEETH | | | | | | | | | | | |
| Assembly level | | | | | | | | | | | |
| Disengage Part 1 | Part 1 Part 2 | Assembly inoperable | Force does not break Part 1's teeth | Part 1 teeth too strong | 6 | 5 | 5 | 150 | 150 | 150 | Apply force to check effects on lever |
| Disengage Part 2 | Part 1 Part 2 | Assembly inoperable | Part 1 runs into Part 3 | Part 1 not stiff enough | 4 | 5 | 5 | 100 | 100 | 200 | |
| | | | | Part 2 teeth too weak | 4 | 5 | 5 | 100 | | | |
| Component level | | | | | | | | | | | |
| Separate under load | Part 1 | Force does not break Part 1's teeth | Part 1 teeth too strong | Part 1 tooth geometry | 6 | 5 | 5 | 150 | 150 | 300 | Measure teeth break strength |
| | | | | Material properties of Part 1 teeth- strength | 6 | 5 | 5 | 150 | 150 | | |
| Prevent buckling | Part 1 | Part 1 not stiff enough | Part 1 not stiff enough | Material properties of Part 1 body: decay | 4 | 5 | 5 | 100 | 200 | 200 | measure load |
| | | | | Geometry of Part 1 body: strength decrease | 4 | 5 | 5 | 100 | 100 | | |
| Shear Part 1 | Part 2 | Part 2 teeth too weak | Part 2 teeth too weak | Material properties of Part 2 teeth | 4 | 5 | 5 | 100 | 200 | 200 | measure axial deflection |
| | | | | Geometry of Part 2 | 4 | 5 | 5 | 100 | 100 | | |
| Feature level (dimension, material properties) | | | | | | | | | | | |
| Separate under load | Part 1 teeth | Part 1 teeth too strong | Material properties of Part 1 teeth- strength | Geometry irregular | 6 | 5 | 5 | 150 | 300 | 425 | Measure teeth break strength |
| | | | | Incorrect material | 6 | 5 | 5 | 150 | | | |
| | | | | Tooth shank too thick | 5 | 5 | 5 | 125 | | | |
| Prevent buckling | Part 1 | Part 1 not stiff enough | Material properties of Part 1 body: decay | Corrosive environment | 4 | 5 | 5 | 100 | 200 | 300 | |
| | | | Geometry of Part 1 body: strength decrease | Irregular shape | 4 | 5 | 5 | 100 | 100 | | |
| | | | | Root too thin | 4 | 5 | 5 | 100 | | | |
| | | Part 2 teeth too weak | Material properties of Part 2 teeth | Incorrect material | 4 | 5 | 5 | 100 | 100 | 200 | |
| | | | Geometry of Part 2 | Lobe shape incorrect | 4 | 5 | 5 | 100 | 100 | | |

| FUNCTION | ASPECT | EFFECT | F. MODE | CAUSE |
|---|---|---|---|---|
| $F_1$ | $A/C_1$ | $E_1$ | $FM_1$ | $C_1$ |
| | | | | $C_2$ |
| $F_1$ | $A/C_1$ | $E_2$ | $F.M_2$ | $C_3$ |
| | | | | $C_4$ |
| | | | $F.M_3$ | $C_5$ |
| | | | | $C_6$ |
| $F_1$ | $A/C_1$ | $E_3$ | $F.M_4$ | $C_7$ |
| | | | | $C_8$ |
| | | | $F.M_5$ | $C_9$ |
| | | | | $C_{10}$ |
| | | $E_4$ | $F.M_6$ | $C_{11}$ |
| | | | | $C_{12}$ |
| | | | $F.M_7$ | $C_{13}$ |
| | | | | $C_{14}$ |
| $F_1$ | $A/C_1$ | $E_5$ | $F.M_8$ | $C_{15}$ |
| | | | | $C_{16}$ |
| | | | $F.M_9$ | $C_{17}$ |
| | | | | $C_{18}$ |
| | | $E_6$ | $F.M_{10}$ | $C_{19}$ |
| | | | | $C_{20}$ |
| | | | $F.M_{11}$ | $C_{21}$ |
| | | | | $C_{22}$ |
| | $A/C_2$ | $E_7$ | $F.M_{12}$ | $C_{23}$ |
| | | | | $C_{24}$ |
| | | | $F.M_{13}$ | $C_{25}$ |
| | | | | $C_{26}$ |
| | | $E_8$ | $F.M_{14}$ | $C_{27}$ |
| | | | | $C_{28}$ |
| | | | $F.M_{15}$ | $C_{29}$ |
| | | | | $C_{30}$ |
| $F\ldots$ | $\ldots$ | $\ldots$ | $\ldots$ | $\ldots$ |
| $F_m$ | $A/C_{lm}$ | $E_{klm}$ | $F.M_{jklm}$ | $F_{ijklm}$ |

FIG. 14

| | |
|---|---|
| Appendix : Process FMDA | |
| Building sequence | |
| 1 | Focus on high risk operations or high risk functions |
| 2 | Using Verb-Noun Logic, list the basic functions of the operation. Key secondary and tertiary functions should also be listed |
| 3 | Specify the effect on the end user and/or a subsequent operation if the function is not achieved |
| 4 | For each function of an operation, list all potential failure modes. The key questions is "How could the operation fail to achieve its basic function?" Be as specific as possible |
| 5 | List all potential causes of each failure mode. Be as specific as possible. Be careful of listing many causes when the linkage between failure mode and effect has not been proven yet |
| 6 | Develop a severity rating scale specific to the product. Assign a severity rating to each cause of failure based on the effect of its failure mode |
| 7 | Assign an occurrence rating to each cause of failure using Sensory Scoring Transform |
| 8 | Assign a detection rating to each cause of failure, This rating is based on the ability of current process controls to detect potential failure modes assuming they have occurred |
| 9 | Record the Risk Factor Number (RFN) obtained by multiplying the Severity by Occurrence by Detection Ratings |
| 10 | Combine like effects, failure modes and causes in order to find Pareto |
| 11 | List the focused engineering activities or current design control related to each potential cause of failure |
| 12 | Specify the corrective actions required to reduce the severity, occurrence or detection rating |

FIG. 15

| 510 Process Descriptions | 515 Function | 520 Potential Effects of Failure | 525 Potential Failure Mode | 530 Potential Causes of Failure | 535 Severity | 540 Occurrence | 545 Detection | 550 RPN | 555 Focused Engineering Activities of Current Process Controls | 560 Corrective Action |
|---|---|---|---|---|---|---|---|---|---|---|
| Ballizing Operations | Attach Cam Lobes | Cam Lobe Free to Rotate | Inadequate Interference Fit | Ball size too small | 5 | 5 | 5 | 125 | | |
| | | | | Shaft ID too large | 5 | 5 | 5 | 125 | | |
| | | | | Shaft OD too small | 5 | 5 | 5 | 125 | | |
| | | | | Lobe ID too large | 5 | 5 | 5 | 125 | | |
| | Position Cam Lobes | Cam Lobe Profile Angle Incorrect | Mislocated Cam Lobe | Cam locating fixture worn | 4 | 4 | 6 | 96 | | |
| | Resist Fracture | Broken Cam Lobe Band | Excess Interface Fit | Ball size too small | 6 | 5 | 5 | 150 | | |
| | | | | Shaft ID too small | 6 | 5 | 5 | 150 | | |
| | | | | Shaft OD too large | 6 | 5 | 5 | 150 | | |
| | | | | Lobe band too thin | 6 | 5 | 5 | 150 | | |

FIG. 17

| | |
|---|---|
| Occurrence Rating Scale | |
| Occurrence rating is the likelihood that a specific cause/failure mode will occur | |
| • Uses Scoring technique | |
| • Ocurrence scores get lower as more process knowledge is gained | |
| 5.5 | Process Engineering Judgement or uncontrollable process |
| 4.5 | Analysis to define potential process parameters |
| 3.5 | Verification of Process parameters & specifications. Link to Control Plan. Drifting but controllable process. |
| 2.5 | Characterized operation. Validation of specific failure mode. |
| 1.5 | Process has been stressed. Run at rate. Stable and capable process. |

FIG. 19

| | |
|---|---|
| Detection Rating Scale | |
| Detection rating is an assessment of the current process controls to detect the cause/failure mode | |
| • Uses Scoring technique | |
| • Detection scores get lower as more process knowledge is gained and process controls are put into place | |
| Scale for detailed parts | |
| 5.5 | Process or Product Feature detected in customers hands |
| 4.5 | Process or Product Feature monitored at end of line, using destructive test or visual check |
| 3.5 | Process Product Feature monitored 100% at end of line, using non-destructive repeatable measurement system |
| 2.5 | Process or Product Feature measured at operation, using non-destructive repeatable measurement system |
| 1.5 | Process Parameter is controlled. Fail safe in place to shut down operation. |
| | Whenever product feature and process parameter language is used, verification activities have occurred |

FIG. 20

| Detection Rating Scale | |
|---|---|
| *Scale for assemblies* | |
| 5.5 | Event detected in customers hands |
| 4.5 | Event monitored in house, using destructive test or visual check |
| 3.5 | Product feature is monitored in-house using destructive test |
| 2.5 | Product feature is monitored 100% in-house using non-destructive test |
| 1.5 | Process parameter is controlled. Fail safe in place to shut down operation |
| | Whenever product feature and process parameter language is used, verification activities have occurred |

FIG. 21

FMDA : Scales      EGR Valve

| | Severity | Product Occurrence | Product Detection | Process Occurrence | Process Detection |
|---|---|---|---|---|---|
| 5.5 | Pintle Head falls off – Engine Failure – Walk Home | Product Engineering Judgement | Event Detected in customer's hands during Service Monitoring | Process Engineering Judgement or uncontrollable process | Event Detected in Customer's hands |
| 4.5 | Valve stuck open, Fail Emissions, loss of power | Analysis to define potential product features | Detected during final validation at customer | Analysis to define potential process parameters | Event monitored in-house, using destructive test |
| 3.5 | No EGR, Open Circuit, or Stuck Closed, Fail Emissions, no loss of power | Verification for Product Features & tolerances, Linkage Drawings | Detected during Probe Test of component or Detected when building Product to feature tolerance extremes | Verification of Process parameters & specifications. Link to Control Plan. Drifting but controllable process. | Feature is monitored in-house using destructive test |
| 2.5 | Mis – meter EGR, Loss of valve control, Emission Failure | Validation of conceptual failure modes from FMDA | Detected during specific failure mode testing of component | Characterized operation, Validation of specific failure mode. | Feature is monitored 100% in-house using non-destructive test |
| 1.5 | Exhaust Gas Leak, Minor Emissions Impact | System Level Validation, Multiple Environments to probe for unknown failure modes | Detected before prototype build (e.g. previous generation parts, or analysis) | Process has been stressed. Run at rate. Stable and capable process. | Process parameter is controlled. Fail safe in place to shut down operation |
| | *Assume everything above happens* | *Assume everything above happens* | *Assume everything above happens* | *Assume everything above happens* | *Assume everything above happens* |

FIG. 22

FMDA Scales vs AIAG Standards
Occurence

| | Process Occurrence | | AIAG – Probability of Failure | | Cpk |
|---|---|---|---|---|---|
| 5.5 | Process Engineering Judgement or uncontrollable process | 10 | Very High – Almost inevitable | ≥ 1 in 2 | < 0.33 |
| | | 9 | | 1 in 3 | ≥ 0.33 |
| 4.5 | Analysis to define potential process parameters | 8 | High – Generally similar to previous processes that have often failed | 1 in 8 | ≥ 0.51 |
| | | 7 | | 1 in 20 | ≥ 0.67 |
| 3.5 | Verification of Process parameters & specifications. Link to Control Plan. Drifting but controllable process. | 6 | Moderate – Generally similar to previous processes which have experienced occasional failures, but not in major proportions | 1 in 80 | ≥ 0.83 |
| | | 5 | | 1 in 400 | ≥ 1.0 |
| 2.5 | Characterized operation. Validation of specific failure mode. | 4 | | 1 in 2000 | ≥ 1.17 |
| | | 3 | Low – Isolated failures associated with similar processes | 1 in 15000 | ≥ 1.33 |
| 1.5 | Process has been stressed. Run at rate. Stable and capable process. | 2 | Very Low – Only isolated failures associated with almost identical processes | 1 in 150000 | ≥ 1.5 |
| | | 1 | Remote – Failure is unlikely. No failures ever associated with almost identical processes | ≤ 1 in 1,500,000 | ≥ 1.67 |

FIG. 25

FMDA Scales vs AIAG Standards
Detection

| | Process Detection for Assemblies | Process Detection for Assemblies | | |
|---|---|---|---|---|
| 5.5 | Event Detected in Customer's hands | Process detected in Customer's (higher level or final) bands | 10 | Almost Impossible – No known controls available to detect failure mode |
| | | | 9 | Very Remote – likelihood that current controls will detect failure mode |
| 4.5 | Event monitored in-house, using destructive test | Process monitored at end of line, audit using destructive test or visual test | 8 | Remote – likelihood current controls will detect current failure mode |
| | | | 7 | Very Low – likelihood current controls will detect current failure mode |
| 3.5 | Feature is monitored in-house using destructive test | Process is monitored 100% at end of line using repeatable measurement system | 6 | Low – likelihood current controls will detect current failure mode |
| | | | 5 | Moderate – likelihood current controls will detect current failure mode |
| 2.5 | Feature is monitored 100% in-house using non-destructive test | Process is monitored 100% at intermediate operation using repeatable measurement system | 4 | Moderately high – likelihood current controls will detect current failure mode |
| | | | 3 | High – likelihood current controls will detect current failure mode |
| 1.5 | Process parameter is controlled. Fail safe in place to shut down operation | Process parameter is controlled. Fail safe in place to shut down operation | 2 | Very High – likelihood current controls will detect current failure mode |
| | | | 2 | Almost Ceratin – current controls almost ceratin to detect failure mode. Reliable detection controls are known with similar processes. |

FIG. 26

Product DFMDA

Before Risk Reduction – Scorecard

| Function | Aspect | Potential effects of failure | Potential failure mode | Potential causes of failure | Severity | Occurrence | Detection | RFN | Action |
|---|---|---|---|---|---|---|---|---|---|
| Seal pressure | • Packing | • Reduced braking Force<br>• Ruptured boot | • Air leaks between cylinder & Packing cup | • Excessive clearance<br>• Packing cup O.D. shrinks over time | 4 | 5 | 5 | 144 | • Increase compression<br>• decrease % plasticizer<br>• change type of grease |

After Risk Reduction – Scorecard

| Function | Aspect | Potential effects of failure | Potential failure mode | Potential causes of failure | Severity | Occurrence | Detection | RFN | Action |
|---|---|---|---|---|---|---|---|---|---|
| Seal pressure | • Packing | • Reduced braking Force<br>• Ruptured boot | • Air leaks between cylinder & Packing cup | • Excessive clearance<br>• Packing cup O.D. shrinks over time | 4 | 2 | 2 | 16 | • Increase compression<br>• decrease % plasticizer<br>• change type of grease |

FIG. 27

METHOD FOR DESIGNING PRODUCTS AND PROCESSES

This application claims the benefit under 35 U.S.C ¶ 119(e) of the priority date of U.S. Provisional Patent Application No. 60/306,989, filed on 20 Jul. 2001, the contents of which are herein incorporated by reference in their entirety.

FIELD OF THE INVENTION

The present invention relates generally to methods for designing and manufacturing products. In particular, the invention is related to methods for identifying potential risks associated with design and manufacturing of products.

BACKGROUND OF THE INVENTION

Product failure in the field, or in the customer's office, is usually one of the costliest events that a manufacturer has to manage. Conventional methods rely on various quality control techniques in an attempt to minimize the occurrence of such undesirable events. One common approach is to identify all parts that comprise a product and enumerate all possible failure modes that can be ascribed to those parts. This approach leads to extensive evaluation of myriad parts that may minimally be related to the actual undesirable event. As a result, a disproportionately high level of resources are directed towards a seemingly limited number of causes that are responsible for the failure of a few part(s), and hence that of the product. A need exists, therefore, for a method that adequately directs, or, focuses, engineering or management resources on those parts that have a high risk of failing, and for prioritizing the risks.

SUMMARY OF THE INVENTION

There has been a long felt need to be able to identify potential failures of a product, preferably in the conceptual stages of the products design, when corrective action can be taken with the least cost. The present invention meets this need by providing a method for identifying potential risks in the early development stages of a product, including the design phase and the manufacturing, or, processing phase of the product. The method employs a failure mode detection analysis (FMDA) approach, which is applicable to both the product and the process of making the product. Furthermore, FMDA approach can be performed on a product or a process as well as across a range of products or processes.

In one aspect of the invention, the method involves identifying a set of functions for the product. These functions are then prioritized in terms of the risks associated with an improper behavior, or malfunction of a respective function. A malfunction results in an undesirable effect. The effect may be economically characterized in two words: an active verb that describes the undesirable effect, and a noun that describes the part or feature of the product that could potentially malfunction. The feature that can lead to a potentially undesirable event in the field, therefore, is discovered in the early stages of the product development, preferably before being released for manufacturing. The disclosed method leads naturally to the discovery of those features of the product that are likely to have a high risk of failing, and not necessarily to all features that may fail. Then the risks are prioritized.

In another aspect of an embodiment of the present invention, potential failure modes, and the causes for the failure modes are identified in order to perform risk prioritization. After having listed all the potential causes for the failure modes, a set of measures is constructed to rate the severity of the malfunction (i.e., the effect of the failure on the customer), the occurrence of failure modes (the amount of engineering activities expanded to reduce the potential of occurrence), and the effectiveness of procedures employed for detection of the causes responsible for the malfunction of the feature(s).

An aspect of an embodiment of the present invention involves a method for addressing risks associated with a product or process. A plurality of risks is identified. A risk factor is assigned to each of the risks, the risk factors capable of being numerically ranked. The risk factors are ranked. A subset of risks based on the ranking is selected, and the risks are addressed in the order of ranking.

An embodiment of another aspect of the invention involves a method for assigning a risk factor associated with one or more aspects of a product or process. A function associated with the product or process is identified. The function is capable of malfunctioning, the malfunction having at least one associated effect. One of the associated effects is selected. At least one potential failure mode is identified with the associated effect and selected. At least one potential cause associated with the failure mode is identified and selected. For the selected cause, an aspect associated with the function responsible for the malfunction is identified. A risk factor is then assigned to at least one of the groups consisting of the potential cause and the potential effect.

In an embodiment of an aspect of the present invention, a method for representing a risk assessment framework is disclosed. The risk assessment is associated with a product or a process having a plurality of aspects. A plurality of elements is assigned for representing the risk assessment. Elements are assigned attribute, phenomenon, measure, and activity categories based on the aspects of the product. The elements are arranged to form the representation of the risk assessment.

An embodiment of still another aspect of the present invention involves a method, in the design of the product, for assigning levels of risk to aspects of a product to facilitate reduction of such risks. An aspect of the product is identified with a potential failure effect, which in turn is associated with a plurality of potential failure modes. A plurality of causes is identified corresponding to each potential failure mode. Measures for rating severity, occurrence and detection of each one of the pluralities of causes are defined. Measures are used to compute a set of numerical risk factors corresponding to each one of the pluralities of potential causes. A highest risk factor of the set of risk factors is assigned to the corresponding one of plurality of potential failure modes. Highest risk factor of the set of risk factors is assigned to the corresponding one of the plurality of potential failure modes. The highest risk factor numerically exceeding other highest risk factors is selected to represent a first representative risk factor for the plurality of the failure modes. Risk factors corresponding to potential causes are then summed. The potential causes have comparably defined characteristics to represent a second representative risk factor for the defined potential cause. The first and second representative risk factors are compared on a bar graph to yield a comparison useful in reducing risk in a prioritized manner.

An embodiment of yet another aspect of the present invention involves a method for analyzing risk associated with a plurality of dissimilar aspects of a product or process. Whether to analyze risk associated with a particular aspect or to compare risk across the plurality of aspects is determined. At least one descriptor of a particular aspect is defined if that particular aspect is to be analyzed. In comparing risk across the plurality of aspects, a plurality of descriptors common to aspects is defined. Depending on whether risk is being analyzed for the particular aspect or across the plurality of aspects, a risk analysis is performed, based on the descriptors, for the particular aspect or for the plurality of aspects to yield a risk assessment of aspects with common attributes.

Still another embodiment of an aspect of the present invention involves assessing risks across a plurality of dissimilar products or functions, or both products and functions, the risks being associated with a set of effects common to the products and functions. A plurality of descriptors for the common effects is specified. An FMDA is performed with respect to the descriptors to yield risk assessment across a set of products and functions.

An embodiment of an aspect of the present invention is a computer-implemented user-interactive method for identifying particular risks associated with at least one of a product and process. The computer is in communication with a display. A failure effect for at least one of the product and process is selected. The display displays a term describing the failure effect. A scale of severity ratings corresponding to failure events for one or both of the product or process is identified. The selected failure effect described in the display is compared to the severity ratings scale. A severity rating for the failure effect is selected. A priority rating is assigned to the failure effect, a failure mode leading to the failure effect, and a cause of the failure mode, wherein the assignment of the priority rating is at least partly a function of a selected severity rating.

Still another computer-implemented user-interactive method affects prioritizing risks of at least one of a product and process. A description of a user-identified failure effect associated with one or both of the products and process is displayed. A severity rating for the failure effect, an occurrence rating for one of a cause, a failure mode leading to the failure effect, and a detection rating for one of the cause and the failure mode leading to the failure effect, are received. A risk factor that is at least partly a function of at least one of the severity rating, occurrence rating, and detection rating is calculated. The calculated risk factor can be combined with a previously calculated risk factor, retrieved from a database, to generate a new risk factor. The new risk factor is compared with previously stored risk factors. At least the risk factor corresponding to a highest risk is selected with no more five functions for one analysis cycle. A description of at least one of a function, failure effect, failure mode, and cause, upon which the selected risk factor is at least partly based, is displayed.

In an embodiment of yet another aspect of the present invention, computer-readable medium is provided containing a program for instructing a computer to execute a user-interactive method for prioritizing risks in order to address priority risks associated with at least one of a product and process. A failure effect for at least one of the product and process is selected. A term describing the failure effect is displayed. The selected failure effect is compared to a scale of severity ratings corresponding to real failure events, each of the real failure events differing from the others. A severity rating for the failure effect is selected. At least one of the failure effects is prioritized. The prioritization is at least partly a function of a selected severity rating.

In an embodiment of yet another aspect of the present invention, a computer-readable medium containing a program for instructing a computer is provided to execute a user-interactive method for prioritizing risks of at least one of a product and process. A description of a user-identified failure effect(s) associated with one or both of the product and process is displayed. A severity rating for the failure effect, an occurrence rating for one of a cause and a detection rating for one of a cause, failure effect, and failure are received. A risk factor that is at least partly a function of at least one of the severity rating, occurrence rating, and detection rating is calculated. The calculated risk factor is combined with a previously calculated risk factor, stored in a database, to generate a new risk factor. The new risk factor is compared with previously stored risk factors. At least the risk factor corresponding to a highest risk is selected. A description of at least one of a function, failure effect, failure mode, and cause, upon which the selected risk factor is at least partly based, is displayed.

In an embodiment of yet another aspect of the present invention, a computer-readable medium containing a program is provided for instructing a computer to perform a user-interactive method for prioritizing risks in order to address priority risks of one of a product and a process. A user-entered failure effect term, describing a failure effect of one of the product and process is received. The failure effect term in an FMDA representation is displayed. A user-entered failure mode term, describing a failure mode leading to the failure effect is received. The failure mode term in the FMDA representation on the display is aligned horizontally with the failure effect term and to the right of the failure effect term. A user-entered cause term describing a cause leading to the failure mode is received. The cause term in the FMDA representation is aligned horizontally with the failure mode term and to the right of the failure mode term on the display. A scale, wherein specific engineering activities, for one of reducing occurrence of failure modes and increasing probability of detection of causes, are described and assigned quantitative scores on the display. A user-selected score in the same metric as the scale is received. A risk factor is calculated based on the user-selected score. The score is compared with other previously calculated risk factors, and a priority risk is identified based on the comparison of risk factors.

BRIEF DESCRIPTION OF DRAWINGS

FIG. 3 is a tabular presentation of an FMDA representation showing the column headings used, in an embodiment of the present invention.

FIG. 5 is a Design FMDA representation of FIG. 3 applied to the brake actuator of FIG. 4, in an embodiment of the present invention.

FIG. 6 shows an embodiment of a product Severity Scale, according to the present invention, as compared to AIAG scale.

FIG. 7 shows an embodiment of a product Occurrence Scale, according to the present invention, as compared to AIAG scale.

FIG. 8 shows an embodiment of a product Detection Scale as compared to AIAG scale.

FIG. 9 shows a summary of embodiments of Design FMDA scales.

FIG. 11 shows a Design FMDA used for a valve, according to the present invention.

FIG. 13 is an FMDA representation showing the successive shifting of causes towards failure modes and failure effects as the FMDA shifts its focus from an assembly view to components, and further deeper into features, according to the present invention.

FIG. 14 is a chart showing a generalization of FIG. 13 for performing more extensive FMDA, according to the present invention.

FIG. 15 is a chart showing aspects of Process FMDA, according to the present invention.

FIG. 17 is an FMDA representation as it applies to FIG. 16, according to the present invention.

FIG. 19 shows an occurrence rating scale, according to the present invention.

FIG. 20 shows a detection rating scale, according to the present invention.

FIG. 21 shows a detection rating scale for assembled parts, according to the present invention.

FIG. 22 shows a table showing FMDA scales for product and process detection and occurrence, according to the present invention.

FIG. 25 shows a comparison of AIAG Standards Occurrence scale with that of the Process FMDA scales of the present invention.

FIG. 26 shows a comparison of AIAG Standards Detection scale with that of the Process FMDA scales of the present invention.

FIG. 27 shows the use of an FMDA representation as a scorecard, according to the present invention.

DETAILED DESCRIPTION OF THE INVENTION

The present invention is directed to methods of identifying and prioritizing potential risks involving design and operation of processes, in order to remedy quickly and efficiently the primary causes for existing or potential failure modes. The methods involve a systematic approach available to all levels of an organization responsible for design and implementation of the product or process, from top management to personnel on the manufacturing floor.

According to the present invention, FMDA is directed to functional aspects of a product, and/or to functional aspects of the process that creates the product. A product is a physical item that is created by a manufacturing process. It is an aspect of the present invention that a product and the process that creates the physical item, each has a set of characteristic aspects of their own. A product can be an assembly of parts comprising sub-assemblies, components, sub-components, and features such as the dimensions or material properties of the parts, each physical item being an aspect of the product. Similarly, a process that creates the parts can be an assembly of operations comprising process steps, process parameters, process controls, each being an aspect of the process. At least one of a set of product aspects is created by at least one of a set of process aspects. It is an aspect of the present invention that FMDA is conducted by identifying the functions of a product/process, and then arriving at the aspects that cause malfunctioning of the product/process.

Figure 1:
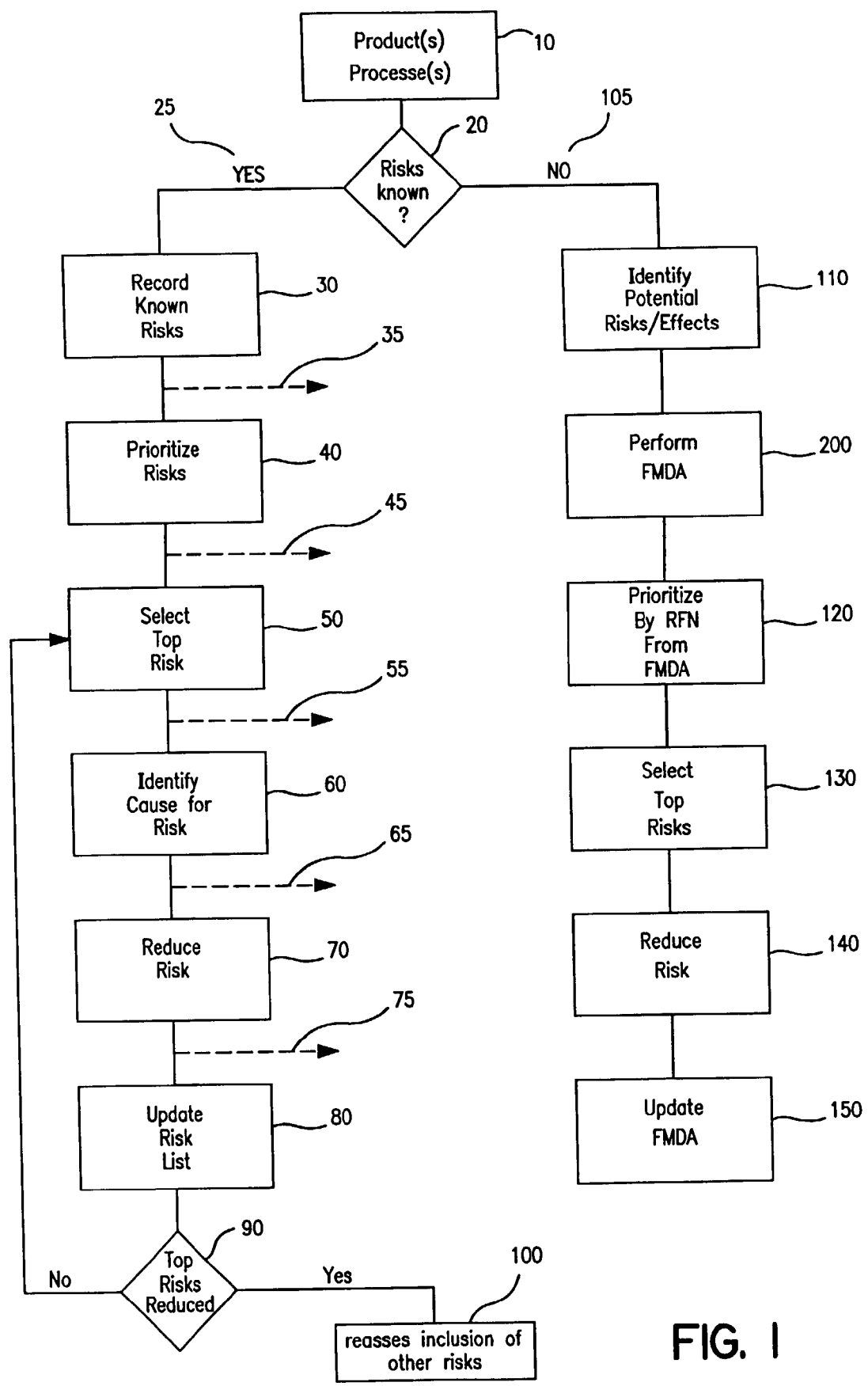
FIG. 1 is a flow chart illustrating steps of performing Failure Mode Detection Analysis (FMDA) for prioritizing known and unknown risks in product design and processes, according to the present invention.

FIG. 1 shows an aspect of an embodiment of the invention. Starting with the products and processes which may be (hereafter referred to as P/P) 10 of a manufacturing organization, it is generally expected that higher levels of management are aware of those high-risk products and processes that are associated with failures in the field or on the manufacturing line. Those risks that are known are recorded as a list of known risks 30 as shown in the same Figure. It is also possible that the severity and occurrence of a malfunction of an aspect of a product or a process are also known so that the risks are prioritized 40 based on existing knowledge in the organization. Then, a set of identified high-level risks is selected 50 in the order of priority established previously in 40. It is possible that the causes for the high-risk failures for the P/P are also known. Appropriate action is then taken to remedy the cause for the first highest level of risk 70, and the risk list is updated 80. If there are other risks remaining in the high-risk list 90, then the causes for the other risks are identified 60 and acted upon 70 until the list is exhausted 100.

If, on the other hand, the level of risks are not known yet, then, as shown in another aspect of the present embodiment in FIG. 1, those potential risks are identified and recorded separately 110. Because of the unknown nature of these potential risks, and the need for expeditious identification and remedy of these risks, a separate analysis, called Failure Mode Detection Analysis (FMDA) 120 is performed. FMDA can be used when a known problem is occurring to score how effective the actions taken to potentially reduce severity, occurrence and/or detection are in protecting the customer as well as the shareholders. FMDA can also be used after a known problem is fixed in order to further mitigate risk associated with other potential Effects, Failure Modes and/or Causes. However, FMDA is not limited to only a specific type of risk analysis. The method, as disclosed in the present invention, can be applied to situations where an element of risk needs further analysis. Thus, an FMDA can be performed in the design of a product or in the manufacturing or processing of the product. FMDA, therefore, generally applies to both the product and the process. For specific application to design, it will be designated as DFMDA and as PFMDA when the application is to a process.

Thus, in branch 25 of FIG. 1, if the risks are known but cannot be prioritized based on existing knowledge in the organization, then FMDA can be performed in achieving the prioritization 35. Likewise, if the failure modes, or causes for the failure modes are not known, then a modified form of the FMDA can be performed. Reference numerals 35, 45, 55, 65 and 75 show alternate branches where portions of the FMDA, as appropriate and as explained below, can be performed to resolve a particular step before proceeding with the next step.

In branch 105 of FIG. 1, subsequent to FMDA 200, prioritization of the various risks is performed based on risk factors (RF) represented as risk factor numbers (RFN) resulting from the FMDA. Then, selecting a set of high-level risks 130, implementing risk reduction by taking corrective actions 140, and updating FMDA 150 follow, similar to the later steps of branch 25.

Figure 2:
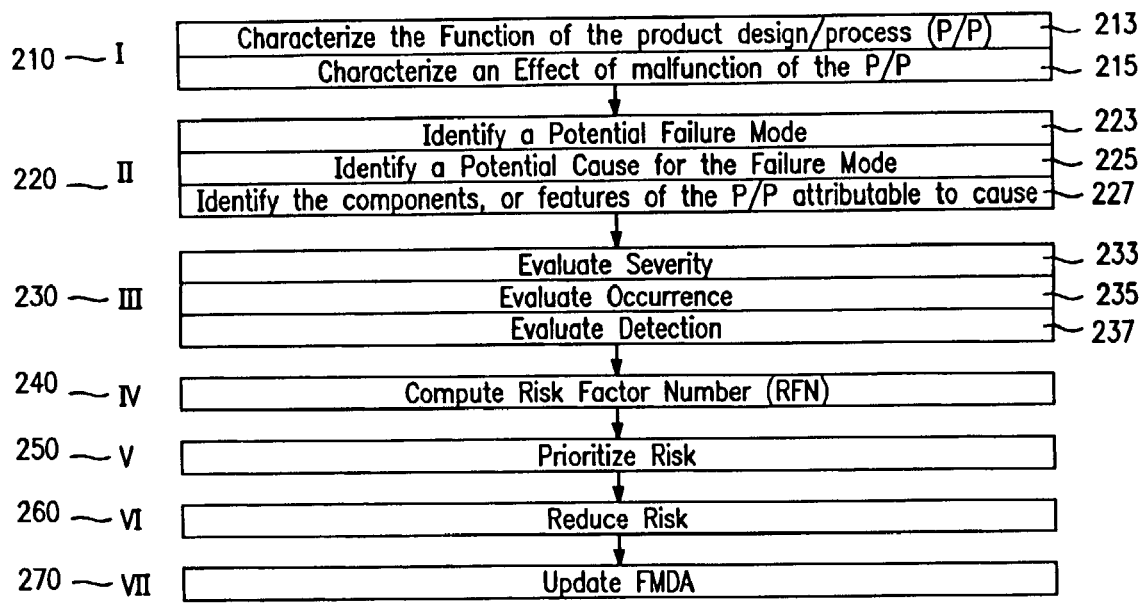
FIG. 2 is a chart showing aspects of performing FMDA in accordance with the present invention.

FIG. 2 shows another aspect of an embodiment of the present invention for performing Failure Mode Detection Analysis, or, FMDA 100. FMDA comprises seven major portions, namely, P/P characterization I, 210; failure (i.e., risk) identification II, 220, failure (risk) evaluation III, 230; risk calculation IV, 240; risk prioritization V 250; risk reduction 260; and updating FMDA 270.

It is common practice in the industry to break down a product or a process into its components, or, aspects, and even to the feature level (e.g., dimension or property of an aspect) first, and then ascribe all possible failure modes or causes for failure to each one and every part and feature. Then, various statistical and other analyses are typically performed. According to the present invention, FMDA is used to first characterize the function that is being performed by the P/P 213, and the consequence or effect of a malfunction in the P/P 215. Identifying a potential failure mode 223, and a potential cause for the failure mode 225, enables the identification of the feature (e.g., dimension or property) 227 of an aspect that is responsible for the undesirable event. In general, there can be a plurality of causes for a potential failure mode, a plurality of failure modes for a potential effect, and the order in which these are identified can also be varied without limitation.

In order to asses the level of risk associated with any one of the potential undesirable effects, failure modes, and causes (collectively referred to here as "elements" of an FMDA), it is necessary to evaluate the severity 233 and frequency 235 of occurrence and the ability to detect 237 these elements. A severity scale, an occurrence scale and a detection scale are used to perform the evaluations, as described below. Each scale has rating values, and the ratings are used to calculate a risk factor number (RFN) IV, 240. The RFNs are then used to prioritize risks associated with corresponding undesirable events.

According to an aspect of the present invention, the elements of the FMDA of the present invention can be represented in various forms, including tables, charts, spreadsheets, or in any data structure format. For illustrative purposes, a tabular representation is shown in FIG. 3. Elements comprising function 300, part or aspect name 305, potential effects of failure 310, potential failure mode 315 and potential causes of failure 320, are entered as headings to the columns, preferably (though without limitation), left to right, as shown in FIG. 3. Next, severity 325, occurrence 330, detection 335, elements are entered as a category of measures for ranking risks. This is followed by a column heading RFN 340, under which risk factors are entered. Finally, a column for recording engineering activities (for addressing the risks) 345 and another column noting actions 350 are added. It is understood that other related columns may be added to the FMDA representation shown in FIG. 3.

Figure 4:
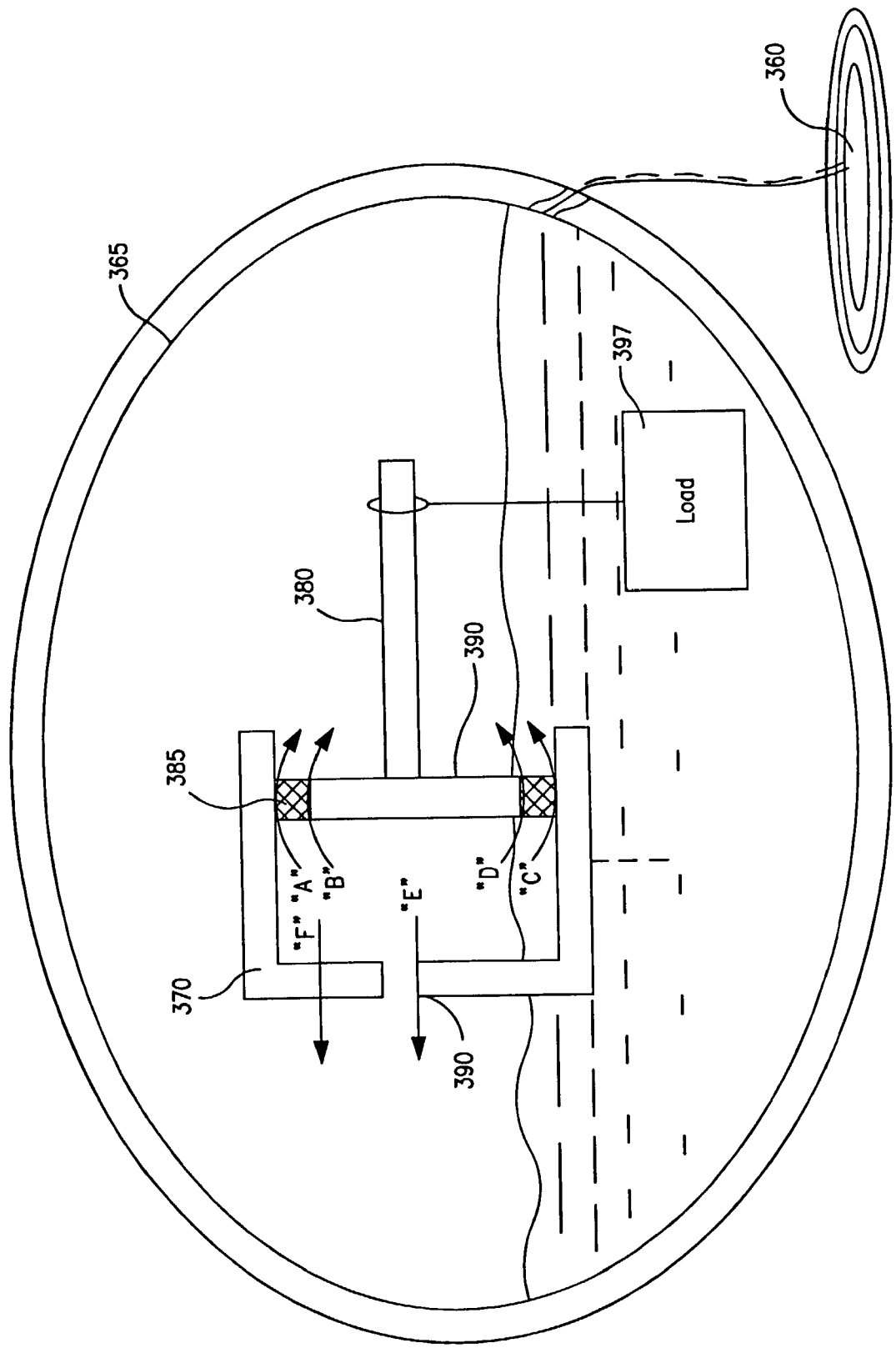
FIG. 4 is a cross sectional view of a brake actuator showing various leak paths representing various failure modes.

An example of a failure mode detection analysis and the use of an embodiment of an FMDA representation according to the present invention are illustrated in FIGS. 4 and 5. The case involves a train brake system shown in FIG. 4, which had the undesirable effect of leaking fluid (air). Leak 360 was observed outside a boot or enclosure 365 surrounding the various components or aspects of the braking system. The key aspects of the braking system comprised: cylinder 370, piston 375, actuator shaft 380, packing cup, or seal 385 and a threaded opening 390 which accepted a threaded pipe to introduce pressurized fluid into chamber 395. In response to observation of the leak, the initial measure taken was to design and manufacture a strengthened boot to better withstand the pressure inside the boot. It soon became obvious, however, that the function of the boot was not to operate under pressure.

Knowing the function of the brake, and having characterized the failure effect, namely, "leaking brake", the next step, according to the present invention, is to identify the failure modes that can occur in the brake assembly system shown in FIG. 4. The leak can occur in several places. Possible failure modes are: a) cracks in the walls of cylinder 370, b) cracks in the face of piston 375, c) stripped threads 370, or d) defective packing cups 385. In order to test for the failure mode, an experiment was conducted as follows:

Leaking ("bad") and non-leaking ("good") brake assemblies were retrieved from the field. Load 397, weighing not more than 125 pounds was suspended from actuator shaft 380, while chamber 395 was pressurized to a design pressure. (If load 397 was above 125 pounds, the shaft would bend). It was found that the actuator of the leaky "bad" assemblies failed at seal 385 with a load of not more than 17 pounds, while the good ones did not fail up to about 50 pounds of force.

Next, the packing cups were swapped between the good and bad assemblies. It was discovered that, with swapped packing cups, the bad actuator performed as a good actuator, while the good actuator performed as a bad actuator. It was found that the outer diameter of the bad cups had shrunk over time, thus reducing the amount of seal compression, which permitted fluid to leak. Further analysis showed that the plasticizer used in the cup material had to be reengineered to remedy the cause for the failure mode.

The results of this portion of the failure mode detection analysis is shown in the embodiment of the FMDA representation of FIG. 5. First, the characterization of the function of the part is entered succinctly, namely, "seal pressure" in column 300. Next, the name of the aspect characterizing the function is entered, in column 305, as "packing cup." In order to construct an action-oriented FMDA representation, the words describing the existing or potential effect of failure are chosen. It is an embodiment of this aspect of the invention, the effect is identified with a combination of an active verb and the name of the failed attribute. In this case, two effects are observed in the field. The first one is degraded braking. The active verb "reduced" and the noun "brake force" capture one of the observed effects. The other effect is related to the leak from the boot, and the words "ruptured boot" encompasses the undesirable effect. In the case of other undesirable events, several observations can be reported, and they are entered accordingly. It is another aspect of the present invention that the verb chosen should be an action-oriented, active word, while the noun is the name of the affected element that is measurable. The combination of the words comprise: active verb/measurable noun.

Similarly, a combination of an active verb and a "measurable" noun is used to enter the failure modes in column 315. A measurable noun is the name of an aspect that is measurable. In this example, contribution to the failure effects is one failure mode. An expression for the failure mode is "air leaking between cylinder and packing cup." On the other hand, there is more than one cause for the failure mode, namely: "excess clearance," and "packing cup outside diameter (O.D.) shrinking over time." These characterizations of causes are entered in column 320.

Before entering rating values for the next columns for "severity" 325, "occurrence" 330 and "detection," a separate rating analysis is performed, according to another aspect of the present invention. However, it is an aspect of the present invention that once the failure modes and causes are identified with the aid of the "truncated" FMDA of FIG. 5, it is possible to skip to columns 345 and 350 in order to take the necessary actions quickly to remedy the undesirable event. This is because the severity and the occurrence of the undesirable event may be clearly apparent from the reports from the field, and there is no need for further analysis.

In another aspect of the present invention, the severity, occurrence and detection are rankings and ratings are accomplished in a manner that is action-oriented. Before the rating can be accomplished, a ranking procedure is followed. Still another aspect of the present invention involves a scale for the ranking and rating. A preferred scale comprises a range from 1.0 to 6.0. The range is further partitioned into regions defined by "half-points" and "full-points." Full points are whole number digits, while "half-points" are fractional numbers as given by 1.0, 1.5, 2.0, 2.5, 3.0, 3.5, 4.0, 4.5, 5.0, 5.5 and 6.0. Severity, occurrence and detection measures are first ranked using a "half-point" portions of the scale ranging from 1.5, 2.5, 3.5, 4.5 to 5.5. After the ranking has been accomplished, a further rating is performed in a "full-point" scale ranging from 1, 2, 3, 4, 5 to 6. It will be understood that scales with other numerical values can be also be constructed.

A ranking scale for measures Severity, Occurrence and Detection are shown in FIGS. 6, 7 and 8, respectively. In FIG. 6, an example concerning an exhaust gas recirculation valve (EGR) is used to contrast the present invention with a conventional technique in order to bring out important distinctions. The well-known AIAG technique shown in the last column of FIGS. 6, 7 and 8 was developed by Automotive Industry Action Group and variants of the technique are used elsewhere, such as in Failure Mode and Effects Analysis (FMEA).

Columns 400 and 410 in FIGS. 6, 7 and 8 show the ranking scale, and the ranking criterion, according to the present invention. Columns 420 and 430 show the conventional ranking scale and ranking criteria, respectively, used by AIAG. The half-point ranking values of the present invention in column 400 are to be compared with the conventional rankings ranging from 1 to 10, and they are shown under column 420 with the corresponding AIAG rows, 421, 422, 423, 424, 425, 426, 427, 428 and 429, respectively. Higher rankings indicate higher risks and lower rankings indicate lower risks.

The range of rating values between 1.0 and 6.0, according to an aspect of the present invention, permits an opportunity to identify criteria for ranking the severity, occurrence and detection of undesirable events. Furthermore, only half-points are used in rankings based on the criteria, so that there is an additional opportunity to re-evaluate the risks, depending upon the actions taken during the interim period. If a subsequent assessment of an undesirable criterion (i.e., effect) indicates a higher risk, then the evaluation is incremented to the next higher full-point, or whole number. If, on the other hand, the assessment indicates a lower risk, then the evaluation is decremented to the next lower whole number. Another aspect of the present invention is that the whole numbers are reserved to be entered as ratings into columns 325, 330 and 335 of the FMDA representation of FIG. 3. An algorithm is used to calculate a risk factor number (RFN), whish is then entered into column 340 of FIG. 3. A rating of 1 signifies the least risk, a risk that is identified and acted upon during the conceptual stages of a product or a process. On the other hand, a rating of 6 signifies the highest risk, such as a risk experienced by a customer in the field.

Scales can be initially set up by gauging the relative impact of the undesirable event(s) on the customer in the field. A set of failure effect criteria that are listed under column 410 of FIGS. 6, 7 and 8 can be generated using methods such as selecting potential failure effects based on those that have previously occurred with prior generation products or similar products. Only the latest and most up-to-date failure effect among the effects shown in column 410 of FIGS. 6, 7 and 8, is entered into column 310 of the FMDA presentation of FIG. 3, while the corresponding full-point ratings are entered into columns 320, 325 and 330, respectively. The rows of Items that are entered into columns 300-320 in FIG. 3 constitute line items for the measure columns 325-340.

The range of scale used under AIAG in FIGS. 6, 7 and 8 is defined over 1, 2, ..., 10 and is generic. Furthermore, criteria corresponding to each value of the ratings under column 430 are generally vague, with broad descriptors, such as "Hazardous without warning," as shown in FIG. 6. In the example involving the EGR valve shown in FIG. 6, any failure effect constitutes a non-compliance issue and would score a 10. Thus the AIAG scale provides no resolution to rank one failure mode's relative importance as against another. The 1 to 4 ratings shown under column 420 in FIG. 6 apply only to "fit, squeak and rattle" issues. Furthermore, since whole numbers are used in the index and the failure effects cannot be judged against real effects that occur to similar products, poor repeatability often results. Also, the rankings in the FMDA severity scale of FIG. 6 correspond to real and differing events, such as "Valve Stuck Open" and Exhaust Gas Leak." This is in contrast to the AIAG scale, which is based on ranking various degrees of the same event, such as "Very low-Fit, finish, squeak" and "Minor-Fit, finish, squeak." This results in less subjective evaluation, leading to more repeatable and representative ratings of failure severity.

In FIG. 7, Occurrence Scale is shown as yet another aspect of the present invention. The occurrence rating is an assessment of the level of engineering activity that should be directed to reducing the potential of occurrence of the failure effect, failure mode, and/or of the cause leading to the failure mode. The failure effect, failure mode, and cause are all related along a chain of events, and assessing the likelihood of one to occur, can also provide information as to the likelihood that the others will also occur.

Occurrence rankings have traditionally been based only on engineering judgment. FIG. 7 also shows a comparison of the disclosed occurrence rankings against the AIAG ranking scale. The AIAG scale is based on occurrence rates an engineer hypothesizes could affect his design. This entails engineering judgment and the scores may not be specific or based on concrete acts, such as engineering measures. In another aspect of the present invention, the occurrence scales are specific and are based on specific concrete engineering measures undertaken to reduce the potential for occurrence of a failure mode, failure effect, or cause. That is, the occurrence scale provides specific scores, corresponding to whether and what type of engineering activity was undertaken that can thereafter be used to reduce the potential for occurrence of an undesirable event. As actions are taken to reduce the likelihood of occurrence, the occurrence ranking is reduced. The occurrence scale used in the FMDA of the present invention is not based merely upon engineer's hunch. Rather, they are based on specific engineering measures or activities that reduce the potential for occurrence of the failure effect. For each ranking in the scale, it is assumed that an action is taken based on analysis performed.

As shown in column 410 and row 401 of FIG. 7, the criterion of engineering judgment is given the highest half point ranking of 5.5. A whole number rating of 5 may be assigned if activity such as FEA (Finite Element analysis) has been performed. A 6 is not based on calculations but on 'I think' type contemplative approach(es) and are implemented to identify functions associated with the product. An FMDA is developed for the product, a credit is given and the half point ranking is decremented by a whole point to 4.5. If design verification is conducted, another credit is given and the half point ranking is further decremented to 3.5.

In another aspect of the present invention, design verification is performed. Design verification involves product assurance. In other words, the product features are measured to assure that they perform according to the design. This can also involve statistically designed experiments at chosen confidence levels to establish realistic tolerance levels for the product features. This approach has the effect of reducing the potential for the recurrence of the failure effect.

In yet another aspect of the present invention, validation, in addition to verification, of a specific failure mode provides another diminution in the half point ranking to 2.5, as shown in row 409, column 410 of FIG. 7. Validation involves subjecting the failure mode to stress testing under different environmental conditions as a function of time. If the specific failure mode, which was conceptualized in the Design FMDA, is validated and the product proves robust, a credit is given and the half point ranking is reduced to 2.5. For example, in the case of the previous illustration of the leaking train brake assembly, the newly reengineered packing cup was baked in grease to simulate time and environment in the field, and the design proved robust when subjected to the test of applying weight to the shaft of the piston. Finally, if the product undergoes a test in multiple environments to probe for failure modes that cannot be conceived in advance, an additional credit is given and the half point ranking reduces to 1.5. Finally, a score of 1 could be obtained with Service Monitoring. During Service Monitoring, a product is repurchased after use and tested until failure. Any degradation that occurred within the product during use is captured within it. If repurchased parts are much weaker than validated parts (subjected to design validation testing) an unknown environment is degrading strength over time. Service Monitoring ensures the supplier finds the problem before the customer does. In order to get credit for service monitoring and achieve a lower score, all activities above service monitoring must have been performed as well. If not, then the highest ranked activity that was actually performed is what should be used.

FIG. 8 shows an embodiment of the detection rankings. A detection score can be given based on how likely it is to detect the failure mode, the cause leading to the failure mode, or failure effect resulting from the failure mode, given the detection systems in place. With FMDA, this likelihood assessment is based on levels of actual detection that are put in place.

The AIAG scale in FIG. 8 utilizes descriptions such as "absolute uncertainty, very remote, remote, very low, low, moderate, etc." The present FMDA detection scale, on the other hand, is based on the level of detection put in place to avoid having failures occur in the field and to protect the customer. "Level of detection" refers to "when and where" a problem is detected by the detection system that is implemented. For example, design teams are rewarded for detecting problems early in the design cycle. It can be said that the question of "can you detect?" protects the customer and the question "when and where can you detect?" protects the stockholder as well as the customer. That is, if the problem is detected before it affects the customer, it protects the customer, but often, this is at a time and place along the design process that is costly for the designer (and therefore, the stockholder). The AIAG scale poses the question, "can you detect the problem?", while the FMDA detection system asks, "when and where can you detect the problem?" Teams are credited for earlier detection systems, provided the downstream detection systems are in place. In FIG. 8, downstream detection systems are assigned the higher detection rankings, indicating greater risk, and upstream detection systems are assigned lower detection numbers for lower risk. Before any credit is taken for an upstream detection system, all downstream detection systems must be in place. (The same is true for Occurrence rankings. That is, all credits taken are only allowed if the actions associated with the higher rankings have been taken).

A summary of the FMDA scales is shown in FIG. 9. The scales are shown both for a product and a process using an exhaust gas recirculation (EGR) valve as an example. In the scale, the lower scores assume that the activity listed above them has occurred. If the activity listed above them has not occurred, a higher number should be used. The event detected can be a failure mode, a cause of the failure mode, or the failure effect resulting from occurrence of the failure mode. As described above for occurrence rankings, the cause, the failure mode and the failure effect, are all related events in a chain. Thus, detection of any of the events in a chain can also result in detection of other related events in the chain that will occur, or that have occurred. Detection thus refers to either direct detection or indirect detection. For example, detecting a failure mode can also detect a failure effect that has occurred, or will likely occur, as a result of the failure mode. Detecting the failure mode also detects the existence of the cause that has resulted in the failure mode. However, whether causes and failure effects identified within an FMDA representation are those that will occur or have occurred as a result of the failure mode, must be verified through engineering activities, such as those described in the occurrence scale.

Having performed the half-point rankings, and the subsequent assessment of the latest failure effect severity, occurrence and detection, the full-point ratings, or scores, are then entered into the respective columns in the FMDA representation of FIG. 3. Next, a Risk Factor Number (RFN) is computed by using an algorithm, preferably, forming a product of the score for the severity of the failure effect, the occurrence score and the detection score. The occurrence and detection scores used are those reflecting the ability to detect, and the ability to expend the necessary engineering activities to reduce the potential for occurrence of a potential failure effect, or failure mode, or cause, that could lead to the failure effect. Thus:

$$\text{Risk Factor Number (RFN)} = \text{Severity Rating} \times \text{Occurrence Rating} \times \text{Detection Rating}$$

The RFN is used to assess overall risk. The lowest possible RFN is 1. A score of 1 should be unlikely as the design team should be focused on high-risk effects before the FMDA work is performed. A starting value closer to 216 is more typical. That is, according to the present invention, high-risk effects are first identified before initiating the FMDA. Any number of techniques can be used to choose the effect with the highest level of risk. These include, but not limited to, the existing knowledge base within the organization, the severity and occurrence of the effect, and other focused engineering activities to identify the risks (e.g., ranking and comparing the severity of effects across a range of functions). However, once initial high-risk effects are chosen, FMDA may be used to continually update the focus. The highest possible RFN for a single effect, failure mode and cause is 6×6×6=216.

Continuing with FIG. 3, column 345 to the right of the RFN column is used to record focused engineering activities that are directed to risk reduction efforts. Some of these activities include, but are not limited to, engineering analysis techniques such as modeling, verification and validation. Last column 350 is used to record corrective actions taken to reduce risk. Once the risk reduction is accomplished, the FMDA is updated as shown in step 150 of FIG. 1.

With RFNs, risks are rank ordered and prioritized as shown in step 40 of FIG. 1. Then top RFNs, preferably not exceeding five (5), are selected in step 50. These five highest risk RFNs offer the greatest opportunity for reducing the occurrence (and severity if the design was improved) of the undesirable event or effect on the customer. As one risk is rolled off the list of the five highest ranked RFNs due to corrective actions taken to reduce the RFN, an assessment is made (reference 100 in FIG. 1), and another risk item rolls up on the list, if appropriate. It is an aspect of the present invention that improvements in the design of products and processes are made in discrete steps, and not necessarily continuously. It is another aspect that RFNs are not the targets themselves to be reduced, but rather that they be used as relative indicators to point to higher risks to be reduced.

Figure 10:
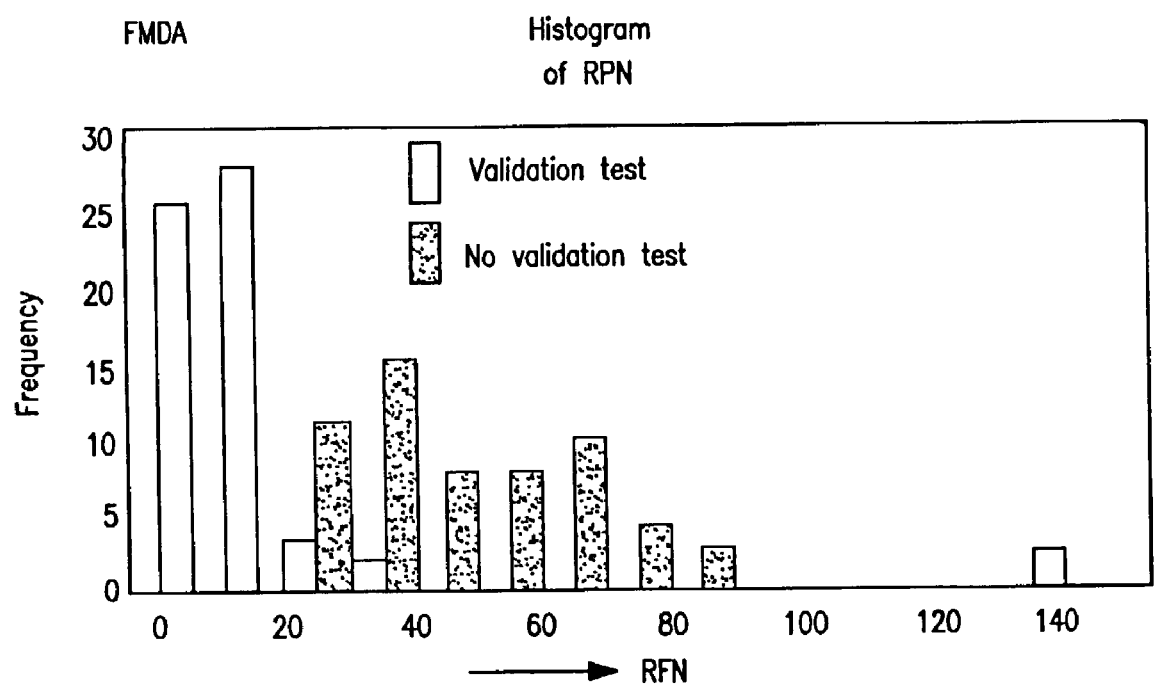
FIG. 10 shows a histogram illustrating a case history showing the significant variances in the distribution of Risk Factor Numbers (RFNs) as a function of the assumptions used in rating, according to the present invention.

An example for how RFNs can be misused is illustrated in FIG. 10. A team was given a "bogie" for RFNs using the AIAG scale between 1 and 10. In working with multiplication of severity, occurrence and detection ratings to obtain the RFN, the team members gave a very low rating for detection assuming that design failure modes and causes would be detected during validation of the product. As a result, they were able to come up with low RFNs, thus meeting their bogies. There were: 25 RFNs with values between 1 and 5; 28 RFNs between 10 and 15; 3 RFNs between 20 and 25; and, 1 RFN between 30 and 35. These 450 are plotted in FIG. 10. The same team was then asked to compute new RFNs assuming that no validation test would be performed. The results 455 are also shown in the same Figure. Inasmuch as validation provides a detection mechanism, and not necessarily a "fix", it was remarkable to see that in the absence of a validation test, a failure mode such as with an RFN number 140 would have probably ended up being detected by the customer let alone during earlier stages. Furthermore, using RFN as a relative, prioritization number, proper focus would have been directed to that failure mode. A simple validation test would have detected that particular failure mode.

Figure 12:
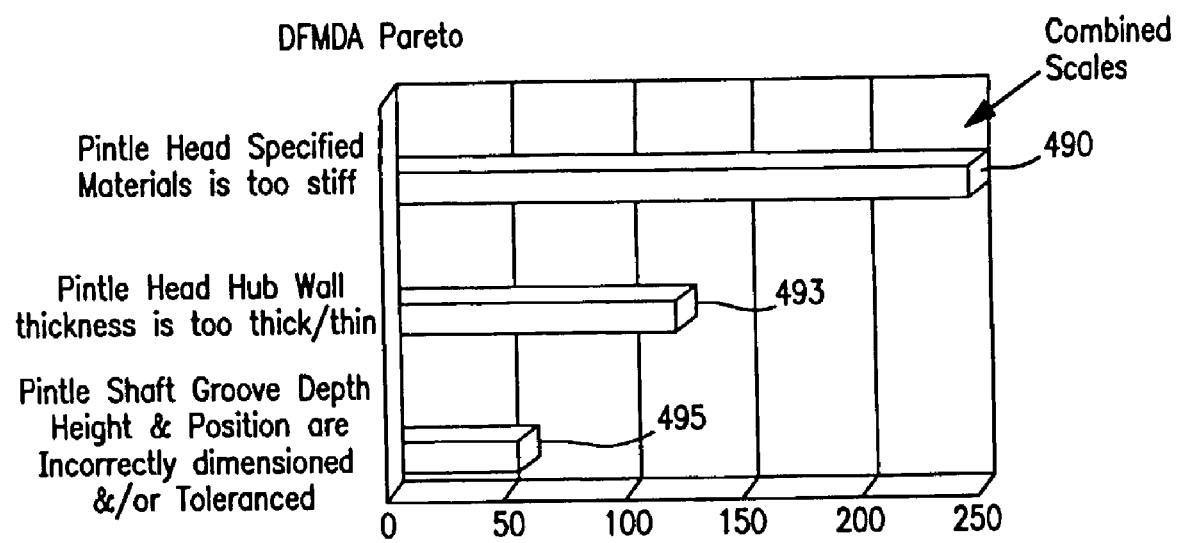
FIG. 12 is a Pareto chart for the valve of FIG. 11 showing stacking of RFNs for prioritizing high-risk effects, according to the present invention.

Pareto Charts can be used effectively to establish priorities. Recognizing that the failure of a critical feature of an aspect of a product or process can create a chain effect, namely, that the failure of the feature can lead to the failure of a component, which in turn can lead to the failure at the system level, and hence leading to the replacement of the product, a preventive measure at the feature level can result in considerable cost savings. Use of the RFNs can point to such "leveraging" features in a system for proper action. That is, according to the present invention, RFNs for related events can be summed together, or, stacked. As an example, if a failure mode has several causes, then the RFN for that failure mode is the sum of the RFNs for all the causes as first shown in FIG. 11 and then in Pareto chart in FIG. 12. In FIG. 11, the individual RFNs for an EGR valve are tabulated in the last column on the right. Two of the RFNs, 470 and 480, relate to the pintle-head material being too stiff, each RFN having a value of 125. The sum of these 2 RFNs 490 is plotted in the Pareto diagram of FIG. 12. Similarly, the sum of the thickness related RFNs, 475 and 485, is plotted 493. The stacking, according to the present invention, provides a means to point out the need to perform design verification and validation on these high RFN related causes.

Summing RFNs can be expanded to aspects of assemblies, subassemblies, components and features according to another aspect of the present invention. Illustration of this approach is shown in FIG. 13, which is an expansion of FIG. 3 where the FMDA representation is extended both vertically and laterally. In the example shown in FIG. 13, levels are explored starting from assembly level 302, going to component level 303, and then analyzing feature level 304 in great detail. Individual RFNs for each effect corresponding to the "depth levels" are computed in column 340, as before. The representation of FIG. 13 has been extended laterally also to accommodate for summing of the RFNs for the failure modes in column 341 and for summing causes in column 343. Thus, individual RFNs are computed under column 340 by forming the product of severity, occurrence, and detection ratings. Then, under column 341, RFNs for the failure mode are summed. It will be recalled that each failure mode takes the higher RFN of the causes for that failure mode, and the failure mode RFNs are summed to arrive at an RFN for the corresponding effect/failure mode. On the other hand, under column 343, the RFNs for the causes are summed directly. As the risk analysis proceeds from the assembly level to the component level, the causes for at the assembly level become the failure mode of the component level. Accordingly, new causes are entered for the newly assigned failure modes. At the same time, the failure modes at the assembly level become the effects at the component level. In other words, the phenomena of cause, failure mode and effect shift left and downward as shown by the arrows in FIG. 13. Likewise, the RFNs for the causes shift left in the same manner as seen under columns 341 and 343. The pattern is repeated as the analysis deepens into the features that make up the components.

The specific example of FIG. 13 depicts the case of an assembly of two parts, Part 1 and Part 2 in which the function of the parts is to disengage, as indicated under column 300. The aspects of the assembly are the sub-assemblies Part 1 and Part 2. At the assembly level, the effect of the malfunction of the functions is that the assembly is inoperable. One of the failure modes is that Part 1 runs into another Part 3. The potential causes for these failure modes are identified in column 320. And the severity of the effect, the occurrence of the cause, and the detection of any of the above are rated in columns 325, 330 and 335, respectively, after proper rankings have been performed.

At the subassembly component level, the failure mode at the assembly level now becomes the effect. Similarly, the causes are shifted left and downwards, as shown by the arrows emanating from column 320 and terminating under column 315. At the component level, a new set of potential causes are identified, and the severity for the effect at the subassembly level, and the occurrence of the cause, and the detection of the cause, severity and the effect are rated as before.

At the next level of analysis, namely, at the feature level of the subassembly, the failure modes of the subassemblies become the effect at the feature level. The causes also shift left and downward and become the failure modes at the features level. The RFN's of individual causes calculated and entered into column 340. Then, the RFNs for the Failure modes are identified. For a failure mode having more than one cause, the RFN with the larger value is selected for that failure mode. (The larger RFN will bring benefit to the customer, because more engineering resources will be directed to minimize risks with larger RFNs). Then the sum of the RFNs for the failure modes is entered under column 341. The sum of the individual RFNs is entered under column 343. These RFN values also shift left, and downwards as shown with the set of arrows under columns 341 and 343, similar to the shifting of the phenomena elements on the left as presented above.

The deeper the analysis, the more detailed is the information obtained, which is valuable for identifying high-risk features. Conversely, the broader the analysis, the less is the information. This can be generalized to exploring risks across products and processes versus within a product/process. By recognizing this shifting described above, one can keep the analysis of assemblies and components (seemingly having dissimilar characteristics) at a common level, and hence, on the same Pareto chart for risk analysis. For example, assembly failure modes and causes can be compared on the same Pareto chart with component effects and failure modes. Thus, RFNs can be kept at the same hierarchical level for comparison across all common levels. However, FMDA is not performed below the failure mode level unless the failure mechanism is understood. For each level, FMDA representation serves as a scorecard for recording the RFNs before and after corrective actions are taken to reduce the occurrence and increase detection of the risks. Also, for each level in another aspect of the present invention, the pattern can be generalized as shown in FIG. 14. In the Figure, F represents the Function under investigation; A/C, Assembly or Components; E, the Effects; F.M, the failure modes; and C, the causes.

According to the present invention, the process FMDA, or, PFMDA, is performed in a similar manner as for the design FMDA, or, DFMDA. It is preferred that Design DFMDAs and PFMDAs are performed concurrently. If the design is not risk reduced, then it cannot be assumed that the design is correct.

The steps for conducting an embodiment of Process FMDA are shown in FIG. 15. The steps comprise: 1) focusing on high risk functions, operations, processes or high risk steps; 2) listing the basic functions, operations and process steps using verb/measurable-noun logic; 3) specifying the effect on the end user and/or a subsequent operations if the function is not achieved; 4) listing all potential failure modes for each function of an operation; 5) listing all potential causes of each failure mode; 6) assigning a severity rating based on the effect; 7) assigning an occurrence rating to each cause of failure; 8) assigning a detection rating to each cause of failure; 9) calculating an RFN by multiplying the severity rating, occurrence rating, and detection rating together; 10) combining like effect, failure modes, and causes in order to find a Pareto, as discussed before; 11) list the focused engineering activities or current design control (process control) related to each potential cause of failure; 12) specify corrective actions required to reduce the severity, occurrence, or detection rating.

Figure 16:
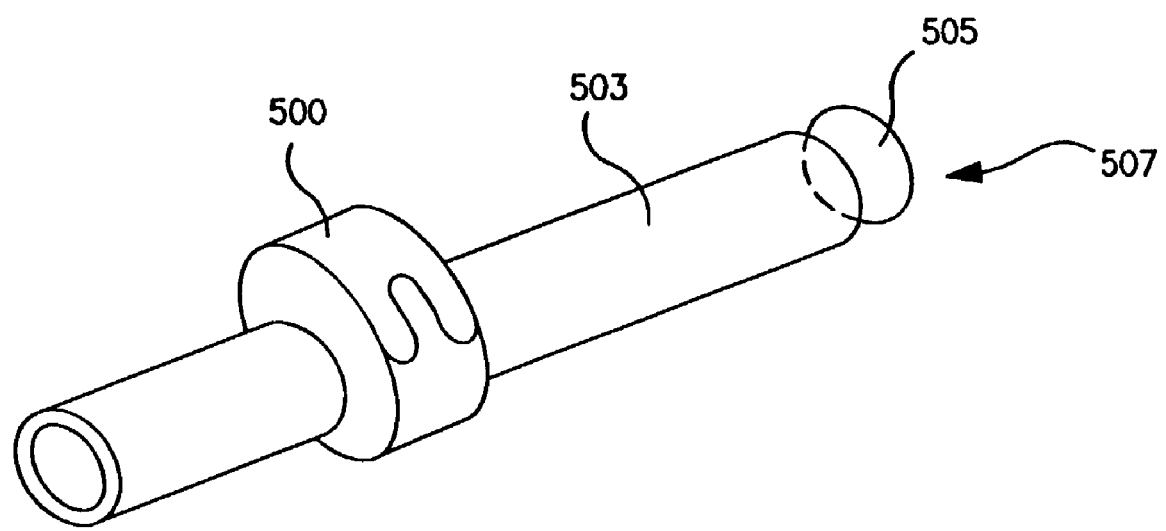
FIG. 16 is a drawing showing a ballizing operation.

An illustrative application of a Process FMDA is shown in FIG. 16. In this application, cam lobe 500 is to be interference-fitted to tubular shaft 503. This is accomplished by forcing ball of a diameter slightly larger than the inside diameter of the tubular shaft through the shaft. The resulting expansion creates an interference fit that interlocks the cam lobe and the shaft. Applying force 507 displaces ball 505 through tubular shaft 503.

A Process FMDA representation as applied in this example is shown in FIG. 17. The first column, 510, describes the process being analyzed. The process being analyzed may be the overall process for creating an assembly, subassembly or part (e.g., camshaft assembly). The process being analyzed may also be an operation (e.g., the ballizing operation) or a step within the operation (e.g., positioning the cam-lobe prior to the ballizing operation).

The second column, 515, shows the functions of the process expressed in active verb/measurable noun combination. These functions are: attach cam-lobes, position cam-lobes and resist fracture.

The third column, 520, shows the effect that the customer will experience if the function is not performed properly. The customer can be internal and external. The final customer is known as the end user. For example, the cam-lobes would be free to rotate if the attach cam-lobe function was not preformed correctly.

The fourth column, 525, describes the failure mode. The failure mode is expressed as a combination of an active verb/measurable noun. Physical and technical language should be used when describing failure modes.

The cause column, 530, contains an active verb/measurable noun description of the cause of the failure. The cause column contains the cause or causes for the failure mode. For example, the causes of an inadequate interference fit can be the ball size is too small (possibly due to wear), the shaft inside diameter is too large, the shaft outer diameter is too small or the cam-lobe inner diameter is too large.

Figure 18:
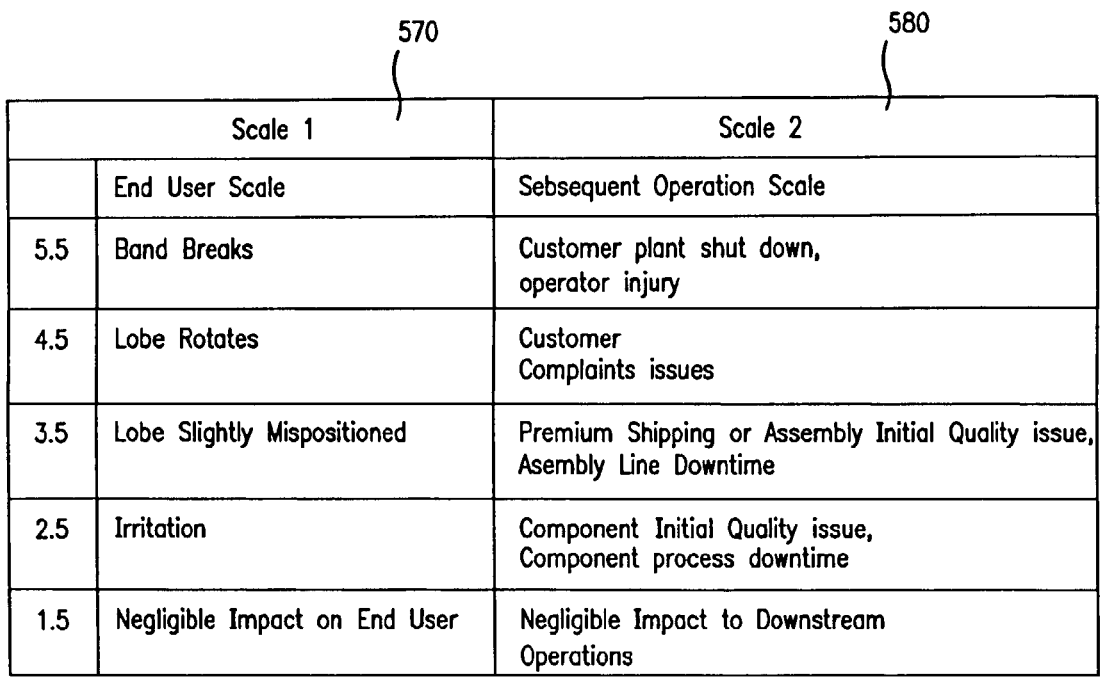
FIG. 18 shows a rating scale for the Process FMDA as applied to FIG. 16 showing a scale for the end-user and another one for operations, according to the present invention.

The three columns that follow the cause column in a Process FMDA in FIG. 17 are for Severity, Occurrence and Detection rating scores, and the rating is the same as disclosed before for the Design FMDA. The severity rating is an assessment of the impact the failure mode will have on the end-user or a subsequent operation. FIG. 18 shows a set of severity scales for the ballizing operation. The worst effect that the scoring team felt a customer could experience is ranked a 5.5. That is, often, a 5.5 value is the highest rating that a current generation product under consideration would have, for it would be the parent generation that would have experienced the top worst rating of 6.0. Other effects are ranked at 4.5, 3.5, 2.5, and 1.5 respectively. Just as for a Design FMDA, the team compares the failure effect they are evaluating to these half points and chooses the half point their failure effect is closest too. Then the effects are reassessed. If the assessment indicates a less risky effect, then the score is decremented to the lower whole number. If higher risky effect, the half-point score is incremented to the next higher full-point score. For example, if a failure effect is closest to 'cam-lobe rotates' at a half-point rating of 4.5 the team making the evaluation would consider if the effect being scored is better or worse? If better it would score a 4 and if it is worse it would score a 5. Just as for the Design FMDA embodiments disclosed previously, this methodology of two selection criteria for scoring improves a team's repeatability.

For Process FMDAs there are two scales, an end-user scale 570 and a subsequent operation scale 580. It is an aspect of the present invention that the worst of the two scores is used.

FIG. 19 shows an embodiment of Occurrence ratings for a process FMDA. Occurrence rating is an assessment of what actions have been taken to reduce the potential for occurrence. Occurrence involves the use of scoring and occurrence rating gets lower as more process knowledge is gained. The failure effect, failure mode, and cause are all related along a chain of events, and assessing the likelihood of one to occur, also provides information as to the likelihood that the others will occur.

Engineering judgment is given the highest half point rating of 5.5. If process FMDAs are developed for the process functions, a credit is given and the half point rating is lowered to 4.5. If verification has been performed, then that takes full credit, lowering it to 3.5. If the specific failure mode, which was conceptualized in the FMDA, is validated and the process proves robust, a credit is given and the half point rating reduces to 2.5. Finally if the process is stressed and run at rate to probe for failure modes that can't be conceived, an additional credit is given and the half point rating reduces to 1.5. A score of 1 could be obtained with a stable and capable process that is monitored and has a process control plan. Monitoring ensures the supplier finds a problem before it effects subsequent operations.

FIG. 20 shows an embodiment of detection ratings for a detailed part. The detection score indicates how likely it is that the failure mode will be detected. The FMDA detection scale is based on the level of detection put in place to protect the customer. Teams are rewarded for detecting problems early in the process. The question "when and where you detect" protects the subsequent customers and the stockholders. The FMDA process poses the question, 'where can you detect the problem'. Teams are credited for earlier detection systems provided that the downstream detection systems are in place.

FIG. 21 shows an embodiment of detection ratings for assembled parts. The actual scale may need to be modified to suit the process being risk reduced. It is an aspect of the present invention that all FMDA scales encompass product design as well as processes. It is another aspect that the invention allows for flexibility in the use of scales. This is shown in FIG. 22.

A summary of the FMDA scales is shown in FIG. 22. The lower scores assume the activity above them has occurred. If the activity above them has not occurred a higher number should be used.

According to the present invention, stacking RFNs is to be managed properly for Process FMDA just as for Design FMDA. The computation of a stacking number can be accomplished by performing mathematical manipulations of different algorithms, in addition to the preferred summing method. Many failure modes and many causes for that failure mode will result in high RFNs. The greater the number of causes, the higher is the sum. In a preferred embodiment when verification knowledge is lacking, the FMDA is not to be layered past the failure modes. Preferably, the initial scorecard is used for the leading five effects and the corresponding failure modes. If every "what-if-what-about," approach is used, this will result in unreasonable amount of verification and process control activities as a result of a high RFNs. Also, false and overly inflated RFNs would yield misleading Pareto charts, and hence erroneous conclusions. Verification and process control activities will reduce the number of causes to a manageable list of critical few. However, this should not be excessive as not every cause is critical. The focus should be directed to finding the critical few causes that matter early on and putting detection systems in place to protect against new ones that may arise.

Figure 23:
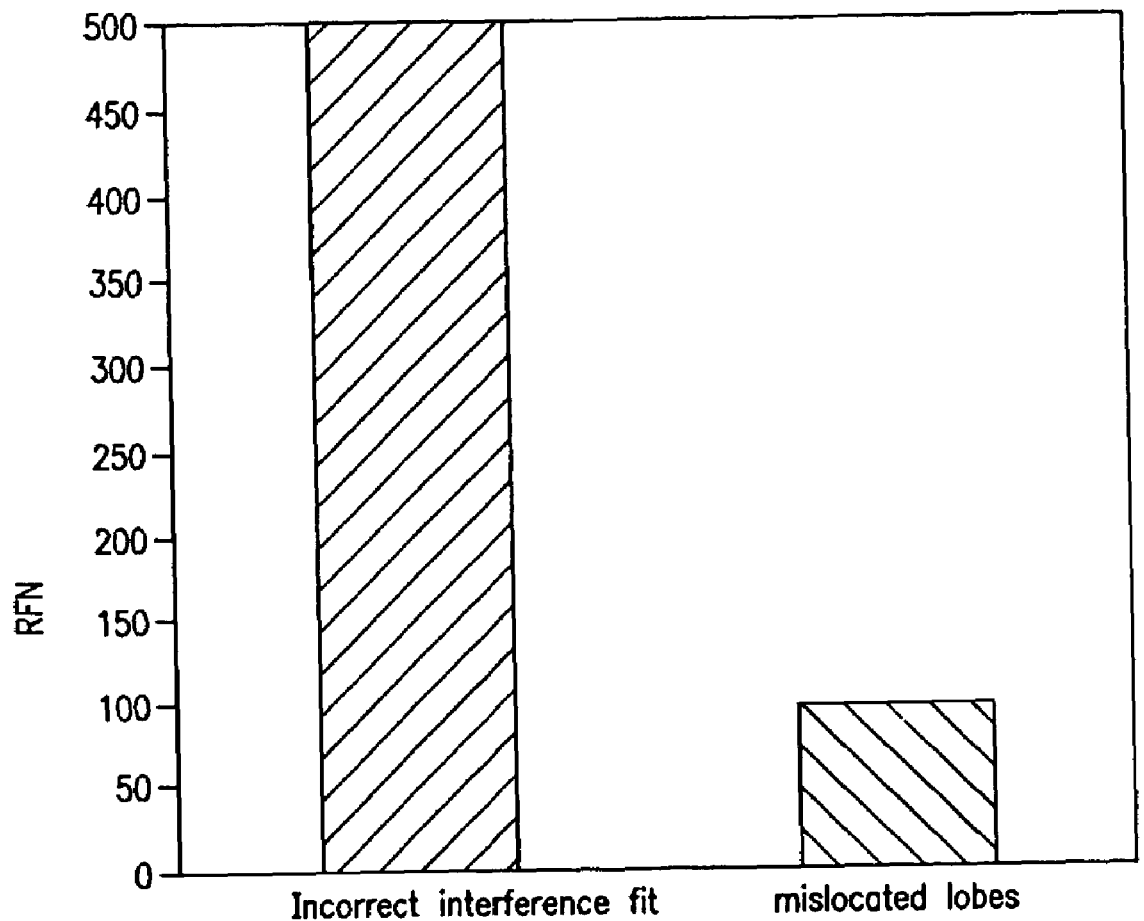
FIG. 23 shows a Pareto chart showing the RFN sum for the ballizing operation of FIG. 16, according to the present invention.

FIG. 23 is a Pareto chart showing the RFN sum for the ballizing operation (See FIG. 17) wherein the RFN sums for excess interference fit and inadequate interference fit are combined, or stacked. The RFN for mislocated lobes failure mode is also shown. Incorrect interference fit should be addressed first. It is number one on the list of the leading five RFNs. The summing of RFNs clearly points to where the priority must be placed in order to remove the highest risk. This will require modeling work and verification and validation activities focused on obtaining the correct interference fit.

Figure 24:
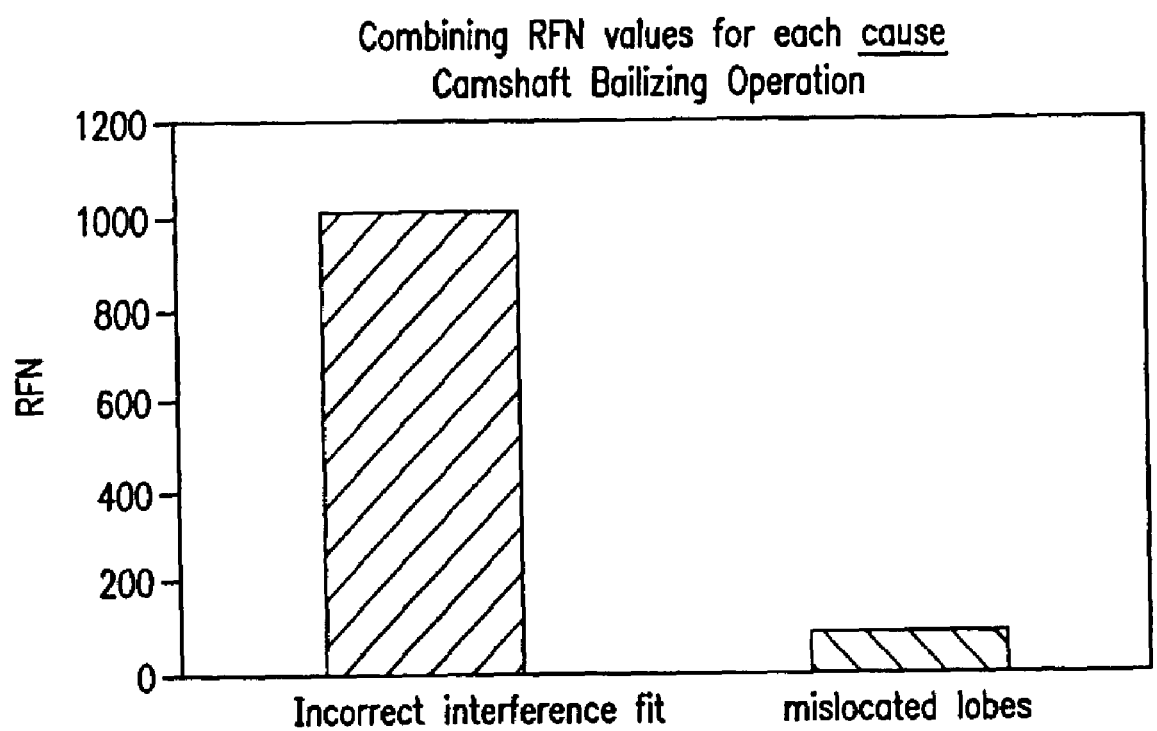
FIG. 24 shows a Pareto chart showing another embodiment of the stacking of RFNs for the ballizing operation of FIG. 16, according to the present invention.

FIG. 24 is another Pareto chart for the same ballizing operation FMDA representation of FIG. 17. Here, the RFNs for the causes of failure related to inadequate and excess interference fit under the "Potential Failure Modes" column, 525, are stacked together, in accordance with one embodiment. This stacking at the "cause level" provides an even stronger emphasis on priority of the "interference fit" failure modes.

Design and process RFNs may be combined in a sum to provide an even stronger Pareto chart. Then design and process engineers together can work together to reduce risk.

The last two columns, 555 and 560, on the Process FMDA, FIG. 17, are for focused engineering activities or current process control. Column 555 specifies additional engineering activities that need to be performed in order to reduce risk. These activities include engineering analysis techniques such as modeling, verification, and process control. The last column, 560, indicates what corrective actions were performed in order to reduce risk. The FMDA is then updated to reflect the new lower RFN numbers.

Similar to a Product Design FMDA, a Process FMDA serves as a scorecard recording the RFN numbers before and after activities directed toward reducing occurrence and increasing detection. They both reduce RFN. Examples of such activities are shown in FIGS. 25 and 26. As shown in FIG. 25, to reduce occurrence, an engineer working with the process may conduct an analysis (not requiring any physical product/process) to find potential control parameters that impact important features. Important features can cause undesirable events to occur, such as effects of failure on customers. The control parameters of a process may be any physical parameter of the process for which a mechanism of control exists. Such an analysis reduces the half point score to 4.5. The engineer may next conduct verification. Verification entails verifying the cause and effect relationships between the identified potential control parameters and the undesirable events. Again, as for the design FMDA, this may require effective measurement systems, conducting statistically designed experiments at chosen confidence levels, and establishing realistic specifications. If such activities are undertaken, the occurrence rating can be reduced to 3.5. Validation of a specific failure mode and characterization of the operation, required to reduce occurrence rating to 2.5, comprise confirming that the specific failure mode is indeed attributable to the identified control parameters. Various methods may be employed to do so and a specific example of a product DFMDA is provided below. For the occurrence rating to drop to 1.5, the process must be intentionally operated with variable parameters such as different operators, equipment, or settings, and run at rate, and be stable and capable.

As shown in FIG. 26, to reduce the detection rating, an undesirable event is monitored in-house to capture the event before it reaches customers. The test may be a destructive test such that it is only based on sampling. Such monitoring reduces the half point score to 4.5. If an important feature that causes or leads to the undesirable event is monitored in house using a destructive test, the half point score is reduced to 3.5. If the same such feature is monitored 100% using a non-destructive test, then the rating drops to 2.5. If the process parameter that impacts the feature of the product is controlled, the rating drops to 1.5.

According to the present invention, the product/process FMDA provides the following benefits: it
1) is an integral part of the review process for risk assessment and commands process characterization to determine critical process parameters that need to be controlled; specifications for the process parameters; and a control plan for monitoring the processes
2) is focused and addresses specific failure modes on specific operations;
3) provides a relative scale that allows for addressing the five highest ranked priorities;
4) is a dynamic document that is continually updated using lessons learned for new products and processes;
5) is an integral part of the change management process wherein when processes or products are changed, the continually updated FMDA can be consulted to determine or provide focus and understanding of any high-risk impacts. Also, using FMDA, risk is analyzed prior to allowing concessions; and 6) can be used as a scorecard.

FIG. 27 shows a Product DFMDA for the brake actuator of FIG. 4. Following the FMDA shown in FIG. 5 for the actuator, the representation shown there is used as a scorecard as shown in FIG. 27. It is an aspect of the present invention that results of a failure mode detection analysis can be recorded before the analysis, as shown in the upper representation of FIG. 27. The RFN before the risk reduction was a high 144. After the risk reduction analysis, the risk factor number is reduced to 16. The severity rating was kept the same. Both the occurrence and detection measures were reduced from 5 to 2 after cause for the shrinkage of the packing cup was determined.

Figure 28:
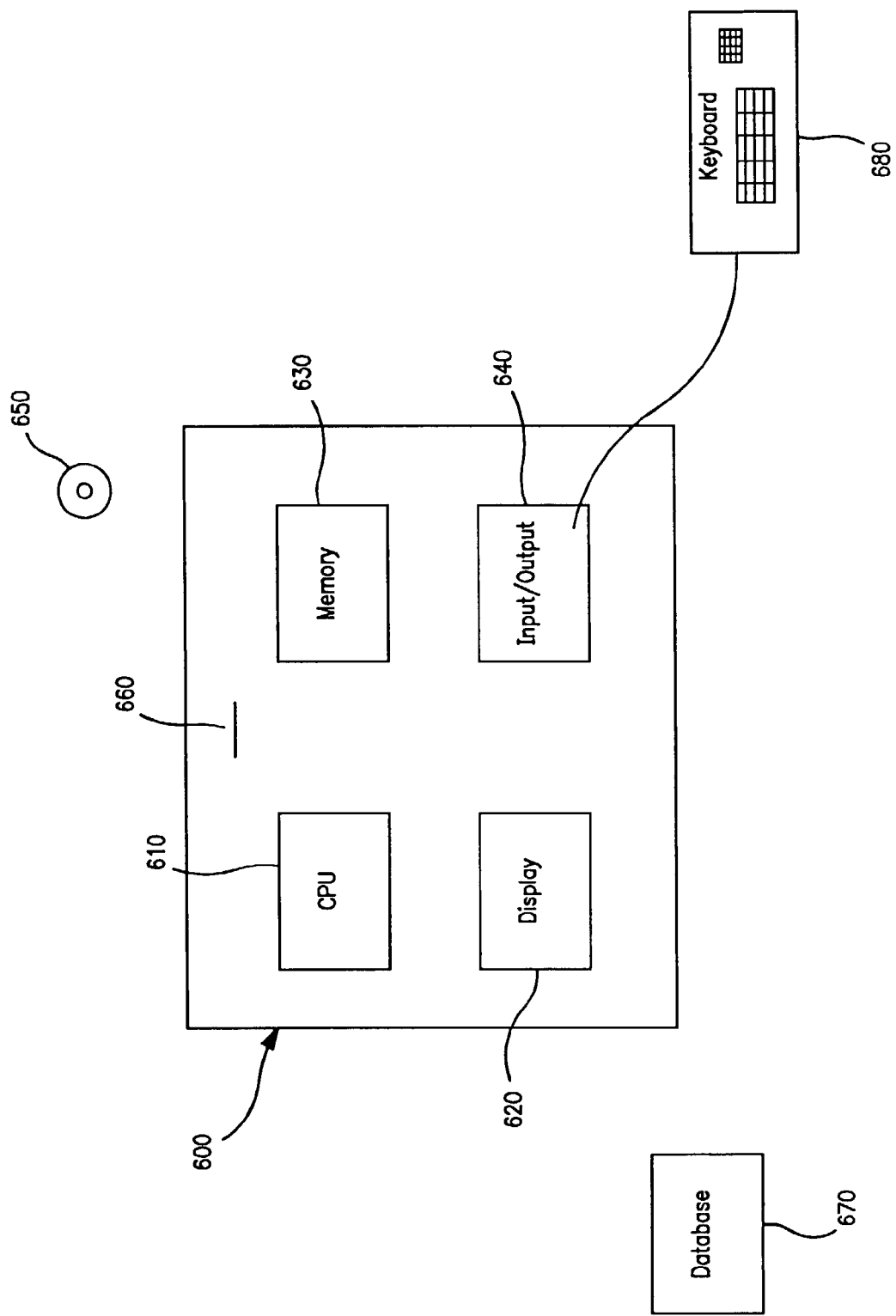
FIG. 28 is a block diagram showing a computer system and various associated or compatible components for implementing the embodiments of the present invention.

The embodiments of the present invention can be implemented through the use of a computer system. FIG. 28 shows a block diagram of a general-purpose computer for practicing the embodiments of the present invention. Computer system 600 includes a central processing unit (CPU) 610, display screen 620, internal system memory 630, and input/output devices 640. In addition, computer 600 includes receiving device 660 for receiving and reading computer-readable media 100, such as a diskette. Although the computer-readable media 100 is represented in FIG. 28 as a CD-ROM disk, computer system 600 can employ other computer-readable media, including but not limited to, floppy disks, tape, flash memory, system memory 630, DVD-ROM, and hard drives. Input/output 640 can be connected to a variety of devices, including keyboard 680 or mouse (not shown). In addition, remote devices that send and receive signals can also communicate with computer system 600 through these input/outputs 640, such as other devices within a network. The computer system also includes database 670. The database is shown as being external to computer system 600 but may be either internal or external in accord with various embodiments of the invention.

One embodiment of the present invention comprises a computer-readable medium, 650 or 630, that contains instructions, or a program, for directing the computer 600 to carry out a computer implemented process or design FMDA, in accord with at least one of the embodiments provided above, or variations thereof. In one embodiment, the computer implemented FMDA includes displaying the appropriate FMDA representation for a process or design, shown in FIGS. 3 and 17. Data entry fields are available for entry of information into the appropriate location in the representation, through keyboard 680. This information is stored in the database 670. The instructions also provide for reading the data or information entered into the field, such as, for example, the form of wording for functions, and suggests combinations of appropriate active verb/nouns. Such instructions may be continually modified or updated, including continually building various selectable databases, such as a database of word combinations that can be suggested, or scales that can be selected for use in providing severity, occurrence or detection scores.

Some embodiments of the program involve calculation of RFNs and prioritization by rank order. The program can calculate and display values or bar charts or Paretos for various combinations of stacked RFNs, based on related effects, failure modes, or causes. In such an embodiment, the leading five stacked RFNs can be identified and can be continually updated by the program.

One aspect of the computer-implemented embodiment comprises displaying a representation wherein a user selected description of effect of failure, function, failure mode, cause, and part name are entered and displayed similar to the FMDA representations of FIGS. 3 and 17. The computer then displays as severity scale for various effects of product failure for a specific product, whereby a user of the method can use the scale to compare the ratings to the selected effect of product failure displayed in the representation. A field is provided for entering and displaying a selected severity rating, or score, for the user-entered effect of product failure. The computer then calculates a risk prioritization rating that is at least partly a function of the user selected severity rating. Also, the computer compares the selected effect, cause, or selected failure mode, to previously selected effects, causes, or failure modes, stored on a data base, and combines the risk prioritization rating with previously calculated combined risk prioritization ratings for like effects and failure modes to generate a new combined risk prioritization rating. That combined rating is compared with previously stored combined risk prioritization ratings that are based on similar severity scales, and the highest combined risk prioritization ratings are displayed.

In yet another embodiment of the present invention, a computer readable medium contains a program for instructing a computer to perform a user-interactive FMDA. The program instructs the computer to receive descriptive terms, and display them in a representation. At the same time, the representation displays descriptions of the term types, such as function, part name, failure effect, failure mode, and cause, to be entered in specific fields by the user. In this way, the user is instructed to arrange term types on the display in a way corresponding to the FMDA representation. That is, the order of the representation is arranged such that terms that describe effects come before terms that describe causes.

Figure 29:
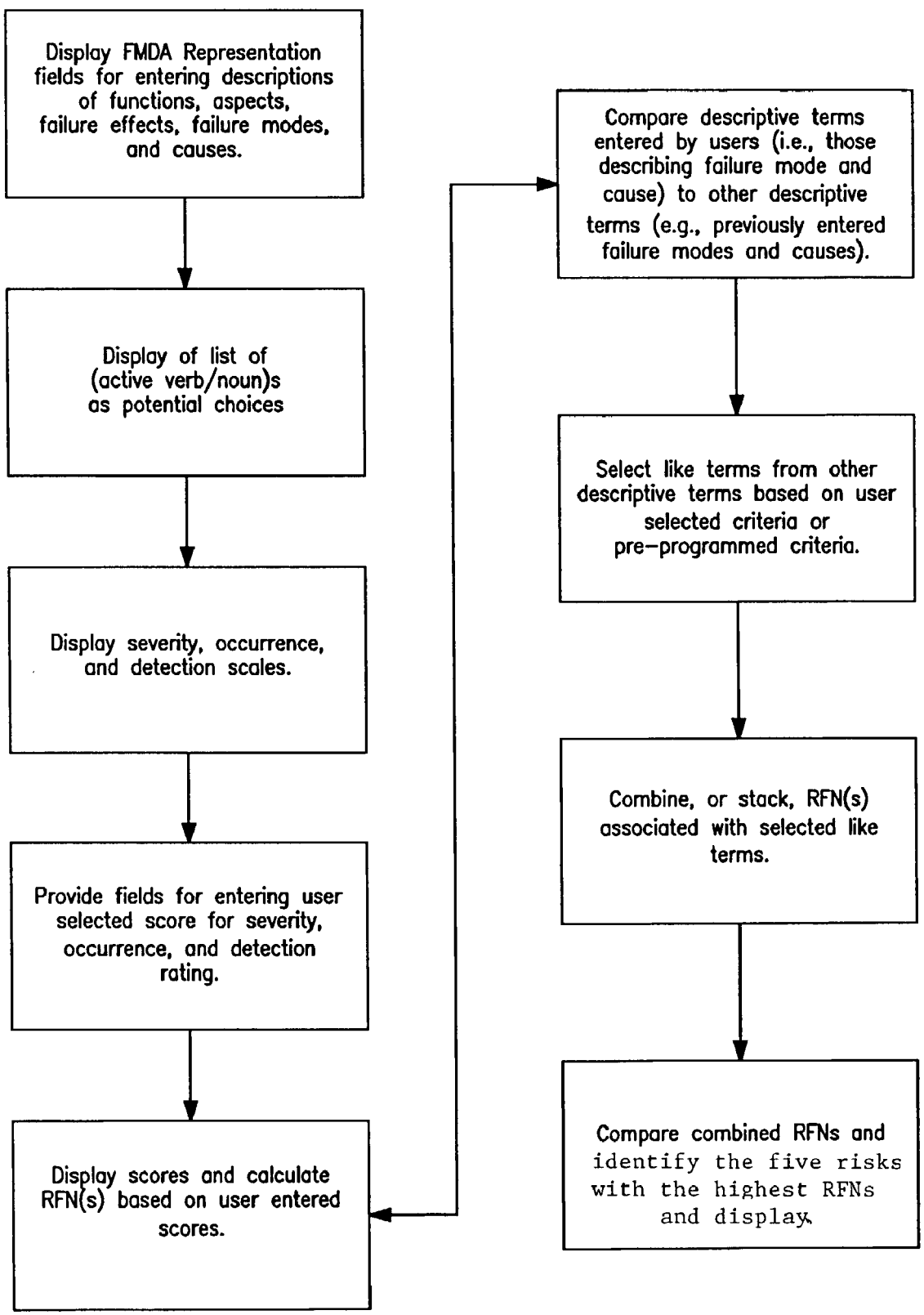
FIG. 29 is a flow chart illustrating an embodiment for a computer implemented FMDA that may be stored in the form of a computer program on a computer readable medium.

In another aspect of the embodiments, the program also instructs the computer to retrieve associated part names, failure modes, causes, effects, or functions, from databases developed for similar products or processes, and the user can select whether they are appropriate for describing the system being designed. The computer readable medium also contains instruction to display specific severity, occurrence, and detection scales, and provide fields for the user to enter scores for the failure modes, effects, and causes being analyzed. The computer readable medium also provides instruction to allow the computer to compare user-entered descriptions for functions, parts, failure effects, failure modes, and causes, to previously entered descriptions of the same that are stored in a database. The user can specify criteria, or criteria can be pre-programmed for selecting similar failure modes and causes and combining RFNs for the selected similar failure modes and causes. The criteria may be based on character comparisons for strings of various length and patterns. Stored RFNs associated with the similar causes and failure modes are stacked or combined. Combined RFNs are then compared and the highest priority risks are identified and displayed (RFNs do not have to be combined if there are no like effects or failure modes, but may still be compared against stacked RFNs). One embodiment of a computer-implemented method that can be stored on a computer readable medium is shown in FIG. 29.

Various embodiments of the present invention can be implemented through use of a computer system, in various forms, such as on stand-alone computer systems, networks, control systems, or combinations thereof.

Although specific embodiments of the invention are described here for illustrative purposes, modifications can be made without departing from the spirit and scope of the invention. The various aspects of the present invention can be applied to virtually any product or process. Also, the teachings themselves, without direct application an actual product or process, encourage the application of the invention and thus the focus of engineering efforts on high priority risks. The various embodiments described can be combined to provide further embodiments. The described methods can omit some acts, can add other acts, and can execute the acts in a different order than that illustrated, to achieve various advantages of the invention.

These and other changes can be made to the invention in light of the above detailed description. In general, in the following claims, the terms used should not be construed to limit the invention to the specific embodiments disclosed in the specification. Accordingly, the invention is not limited by the disclosure, but instead its scope is determined entirely by the following claims.

What is claimed is:

1. A computer-implemented user-interactive method for addressing risk associated with one or more aspects of a product or process, the computer being in communication with a display, comprising the steps of:
   identifying a plurality of risks by recording a plurality of chains of undesirable events associated with at least one aspect of the product or process, each chain of undesirable events including (a) at least one effect associated with a malfunction of an aspect of the product or process, (b) at least one failure mode associated with the at least one effect, and (c) at least one cause associated with the at least one failure mode, with the events being recorded by a user in the order listed above;
   calculating, with an algorithm executed by the computer, a plurality of risk factors and displaying each of the risk factors in association with at least one undesirable event, the risk factors being capable of being summed for like events;
   ranking the risks as a function of the risk factors;
   selecting a subset of the plurality of risks based on the ranking; and
   addressing only those risks that have been selected.

2. The method according to claim 1 further comprising assigning a plurality ratings to the events, wherein the ratings relate to risk levels and are a function of at least one scale containing selectable half-point values and wherein in order to assign a rating to an event a user is required to select a half-point value from the scale as an initial ranking.

3. The method of claim 2 wherein after selecting the initial ranking the user selects an immediately higher, or immediately lower, full point value from the scale for use as a rating assigned to at least one event.

4. The method of claim 2 wherein the range of values on the scale is 1.0 through 6.0.

5. The method of claim 2 wherein the half point values are 1.5, 2.5, 3.5, 4.5 and 5.5.

6. The method according to claim 1, wherein ranking the risks as a function of the risk factors comprises comparing risk factors that have been summed for like events.

7. The method according to claim 6, wherein the like events are causes.

8. The method according to claim 6 wherein the like events are failure modes.

9. The method according to claim 1 further comprising assigning a plurality of severity ratings to a plurality of the events, the severity ratings being used in calculation of risk factors.

10. The method according to claim 9 wherein the severity ratings are a function of a scale correlated to a plurality of different physical events, with each different physical event being assigned a different severity ranking on the scale.

11. The method according to claim 1 further comprising assigning a plurality of detection ratings to a plurality of the events, the detection ratings being used in the calculation of risk factors.

12. The method according to claim 11 wherein the detection ratings are a function of a scale correlated to a plurality of different detection systems for detecting an undesirable event.

13. The method according to claim 1 further comprising assigning a plurality of occurrence ratings to a plurality of the events, the occurrence ratings being used in calculation of risk factors.

14. The method according to claim 13 wherein the occurrence ratings are a function of a scale correlated to a plurality of different engineering activities undertaken to reduce the occurrence of an undesirable event.

15. The method according to claim 1 further comprising recording a function prior to recording the at least one effect.

16. The method according to claim 15 wherein recording the function comprises providing a textual description of the function using an active verb and a measurable noun.

17. The method according to claim 1, wherein the ranking comprises a Pareto ranking.

18. The method according to claim 1, wherein the subset of risks initially corresponds to five functions.

19. The method according to claim 1, wherein the selected subset of risks are all associated with the top five highest risk factors calculated.

20. The method according to claim 1, wherein at least one of the events is recorded using a combination of words comprising an active verb indicating an action, and a measurable noun, indicating a parameter capable of measurement.

21. A method for addressing risk associated with one or more aspects of a product or process, comprising the steps of:
   identifying a plurality of risks associated with at least one aspect of the product or process by recording undesirable events in a display medium;
   calculating a plurality of risk factors for the plurality of risks, and listing the risk factors in visible association with the recorded undesirable events;
   summing risk factors for like undesirable events;
   ranking the summed risk factors;
   selecting a subset of the plurality of risks based on the ranking of the summed risk factors corresponding to the plurality of risks; and
   presenting, on the display medium, the selected subset of the plurality of risks to a user, wherein the user addresses only those risks that have been selected.

22. The method according to claim 21 wherein the calculated plurality of risk factors are a function of risk ratings, the risk ratings being listed in the display medium by a user to be visibly associated with one or more particular undesirable events, the risk ratings being derived from scales having point indications that are each correlated to different physical events, different engineering activities undertaken, or different event detection systems.

23. The method according to claim 22 wherein the point indications are half-points.

24. The method according to claim 23 wherein at least some of the risk factors are calculated as a function of initially selecting at least one of the half-points and thereafter selecting a full point value immediately above, or immediately below, the selected half-point.

25. The method of claim 22 wherein the range of point indications on the scales are 1.0 through 6.0.

26. The method of claim 22 wherein the scales include half-point values of 1.5, 2.5, 3.5, 4.5 and 5.5.

27. The method according to claim 21, wherein the like undesirable events are causes.

28. The method according to claim 21 wherein the like undesirable events are failure modes.

* * * * *